(12) United States Patent
Kawakami et al.

(10) Patent No.: US 9,039,402 B2
(45) Date of Patent: May 26, 2015

(54) IMPRINTING APPARATUS AND METHOD THEREFOR

(75) Inventors: Eigo Kawakami, Utsunomiya (JP); Shingo Okushima, Kawasaki (JP); Hideki Ina, Tokyo (JP); Junichi Seki, Yokohama (JP); Atsunori Terasaki, Kawasaki (JP); Motoki Okinaka, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/566,513

(22) Filed: Sep. 24, 2009

(65) Prior Publication Data
US 2010/0072653 A1 Mar. 25, 2010

(30) Foreign Application Priority Data

Sep. 25, 2008 (JP) ................................. 2008-246334

(51) Int. Cl.
| | | |
|---|---|---|
| *B29C 43/02* | (2006.01) | |
| *B29C 43/00* | (2006.01) | |
| *B29C 43/14* | (2006.01) | |
| *B82Y 10/00* | (2011.01) | |
| *B82Y 40/00* | (2011.01) | |
| *G03F 7/00* | (2006.01) | |
| *B29C 59/02* | (2006.01) | |
| *B29C 43/58* | (2006.01) | |

(52) U.S. Cl.
CPC ......... *B29C 43/021* (2013.01); *B29C 2059/023* (2013.01); *B29C 43/003* (2013.01); *B29C 43/14* (2013.01); *B29C 43/58* (2013.01); *B29C 2043/025* (2013.01); *B29C 2043/142* (2013.01); *B29C 2043/5833* (2013.01); *B82Y 10/00* (2013.01); *B82Y 40/00* (2013.01); *G03F 7/0002* (2013.01)

(58) Field of Classification Search
CPC ........................ B29C 2059/023; B29C 43/021
USPC .......................................... 977/887; 425/385
See application file for complete search history.

(56) References Cited

U.S. PATENT DOCUMENTS

| | | | |
|---|---|---|---|
| 7,077,992 B2 | 7/2006 | Sreenivasan | |
| 2005/0147743 A1* | 7/2005 | Sekiya | ........................ 427/140 |

(Continued)

FOREIGN PATENT DOCUMENTS

| | | |
|---|---|---|
| JP | 2007-182063 A | 7/2007 |
| JP | 2008-042187 A | 2/2008 |
| KR | 10-2007-0115735 A | 12/2007 |

OTHER PUBLICATIONS

Stephan Y. Chou et al., Appl. Phys. Lett, vol. 67, issue 21, pp. 3114-3116 (1995).

*Primary Examiner* — Jeremiah Smith
(74) *Attorney, Agent, or Firm* — Canon U.S.A., Inc. IP Division

(57) ABSTRACT

There is provided an imprinting apparatus that transfers a pattern of a mold to a resin on a substrate, the imprinting apparatus including a deposition mechanism configured to deposit the resin onto the substrate; a first driving mechanism configured to change a relative position, on a plane parallel to the surface of the substrate, of the substrate and the mold; a second driving mechanism configured to change the relative position, on a plane parallel to the surface of the substrate, of the substrate and the deposition mechanism; and a control unit configured to control the deposition mechanism and the driving mechanism so as to perform a resin deposition process of depositing the resin onto the substrate and an imprint process of transferring the pattern of the mold to the resin on the substrate in parallel.

7 Claims, 19 Drawing Sheets

(56) References Cited

U.S. PATENT DOCUMENTS

| | | |
|---|---|---|
| 2005/0270312 A1* | 12/2005 | Lad et al. .......................... 347/1 |
| 2006/0159305 A1* | 7/2006 | Simon .......................... 382/100 |
| 2007/0102838 A1 | 5/2007 | Simon |
| 2007/0278712 A1* | 12/2007 | Okushima et al. ............ 264/236 |

* cited by examiner

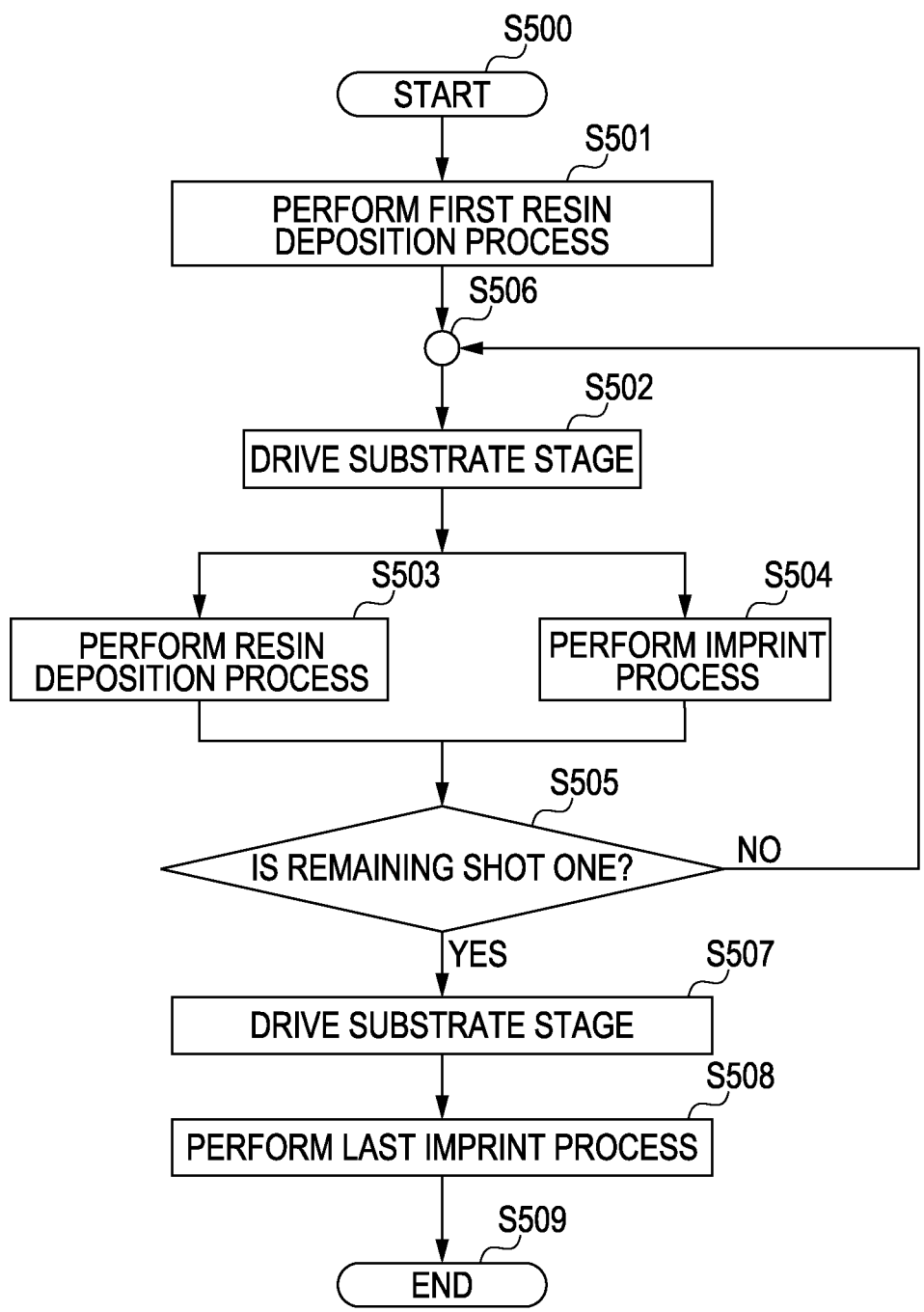

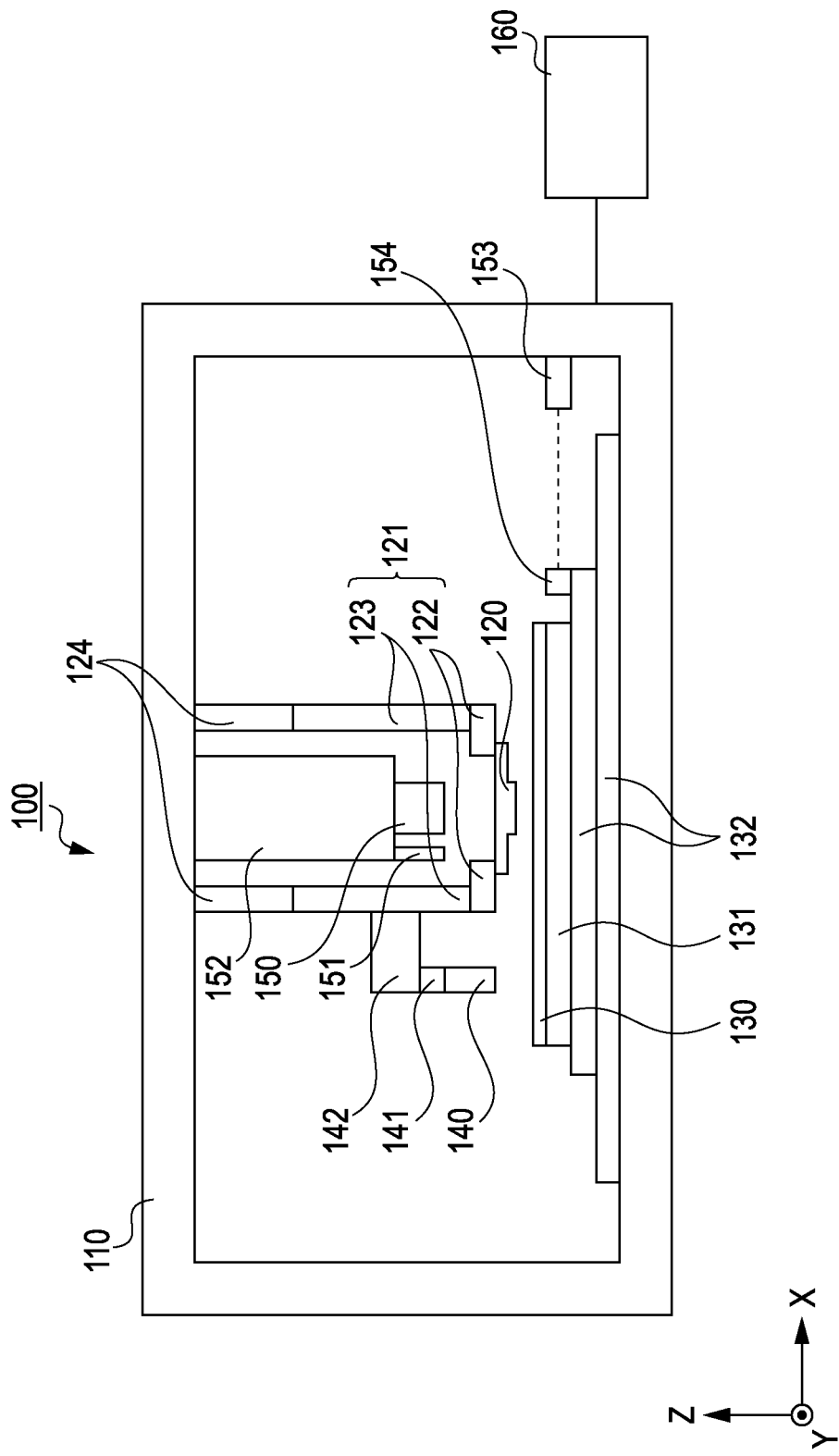

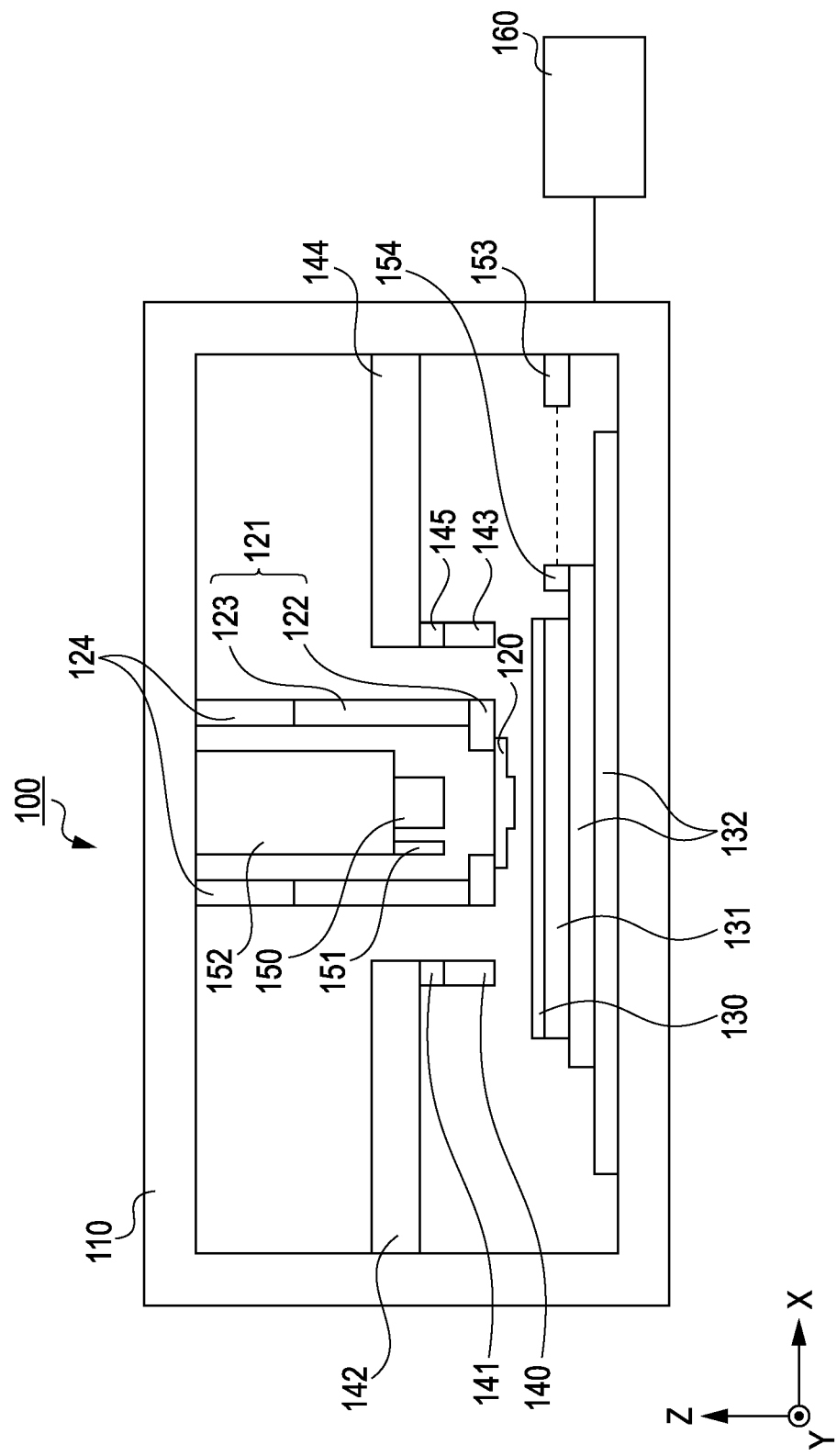

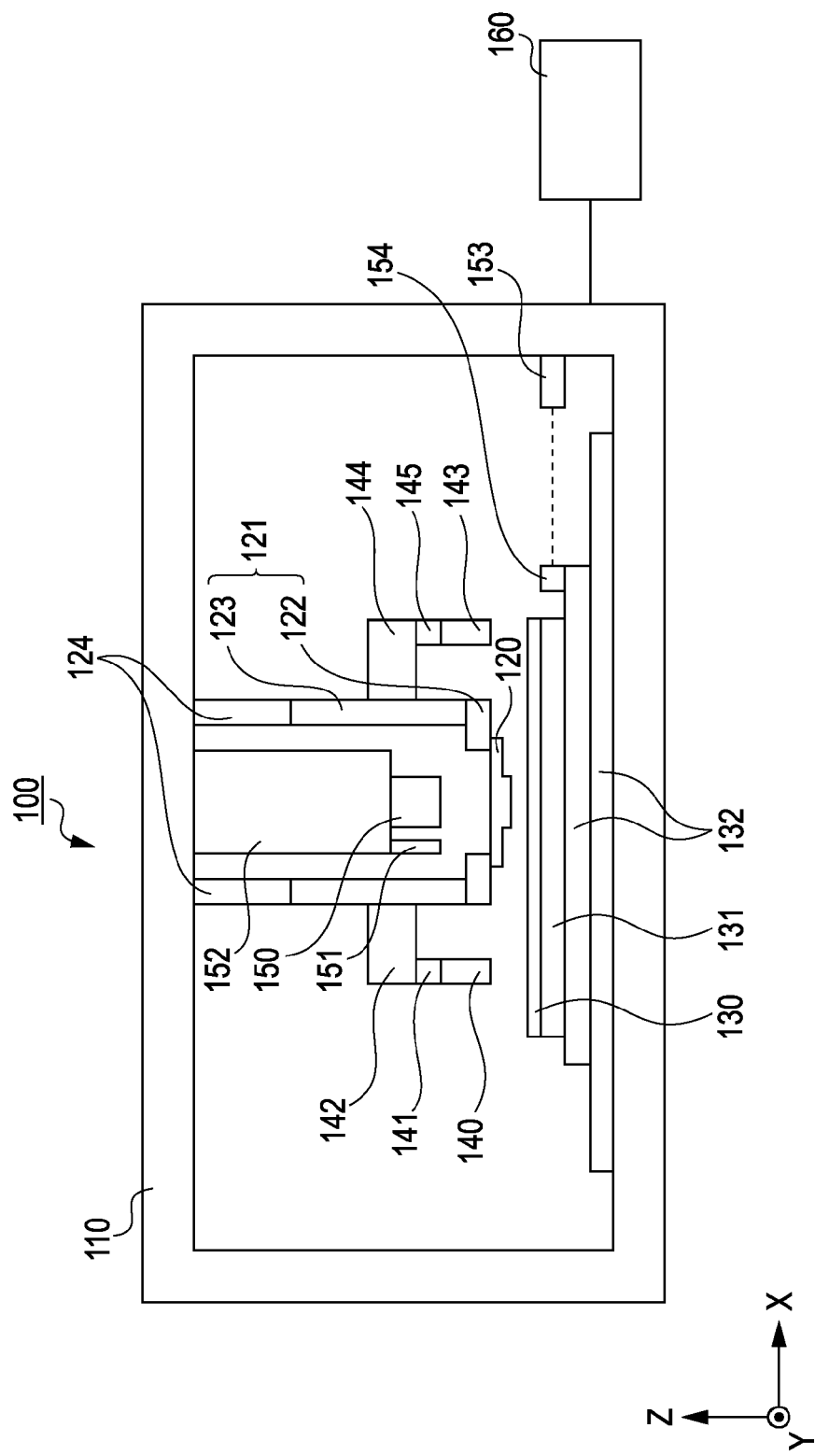

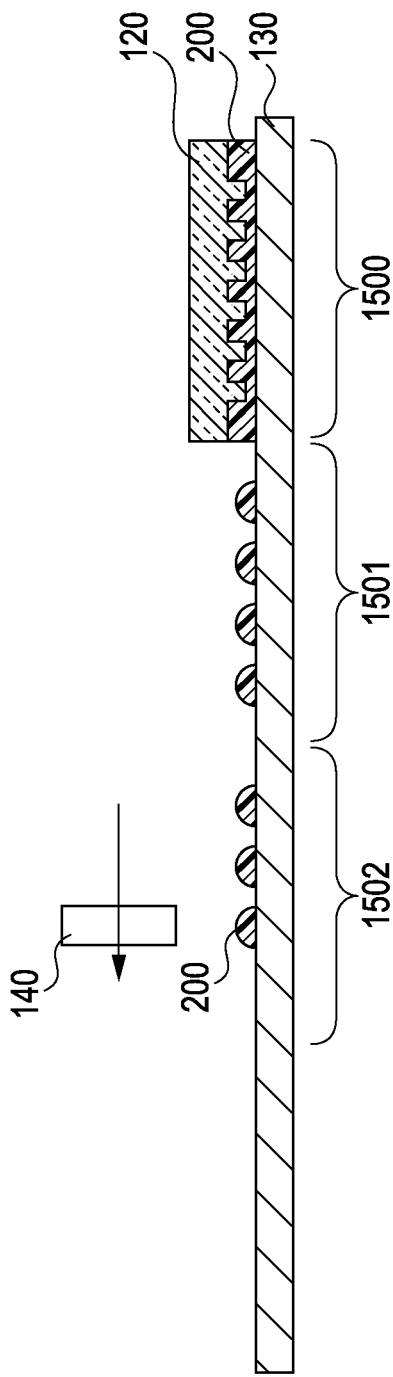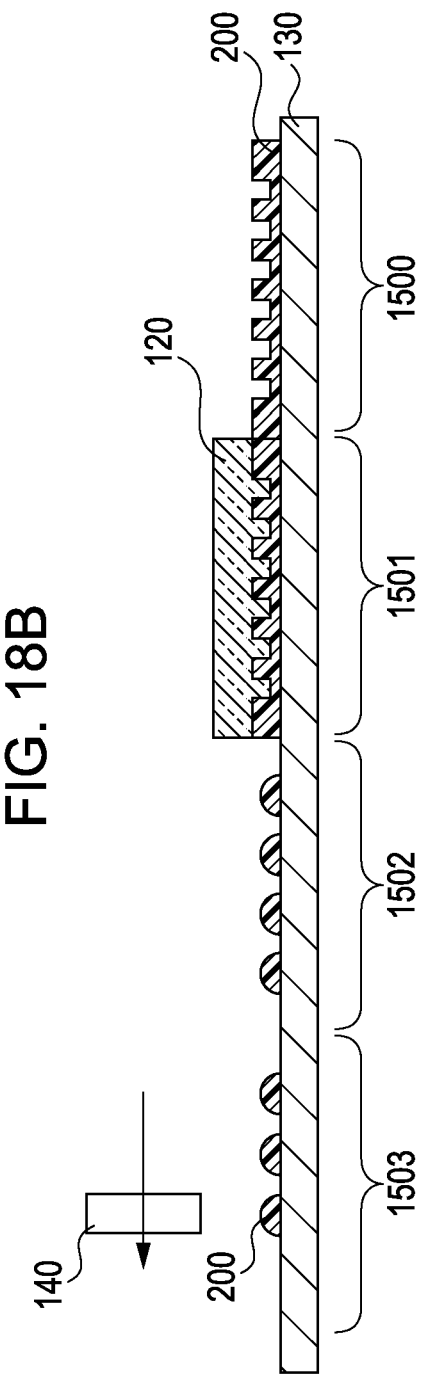

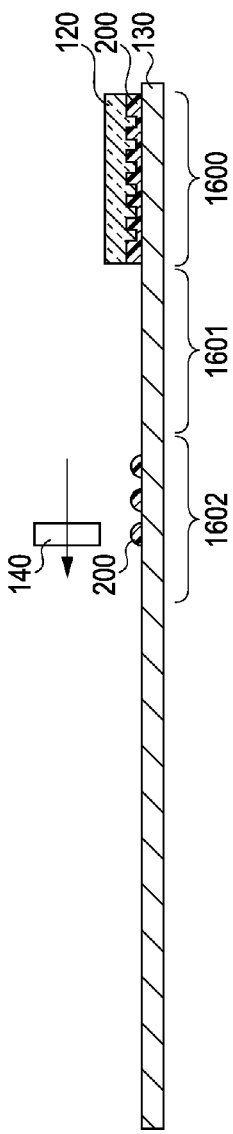
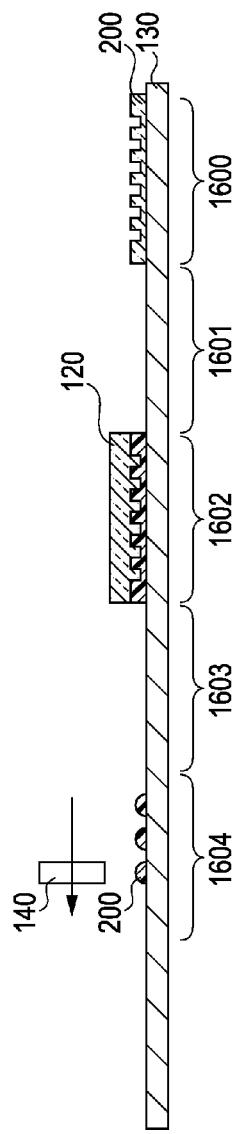
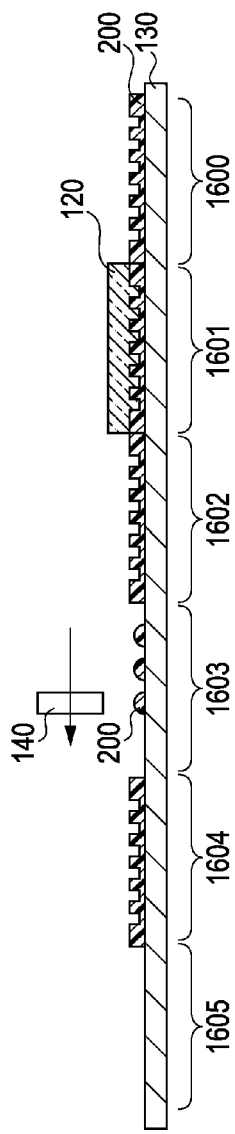
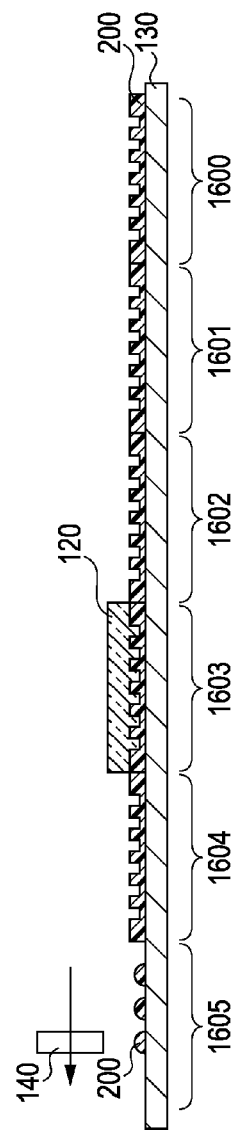

IMPRINTING APPARATUS AND METHOD THEREFOR

This application claims the benefit of Japanese Patent Application No. 2008-246334 filed on Sep. 25, 2008, which is hereby incorporated by reference herein in its entirety.

BACKGROUND OF THE INVENTION

1. Field of the Invention

The present invention relates to imprinting apparatuses that transfer the pattern of a mold to a resin layer and imprinting methods therefor.

2. Description of the Related Art

An ultrafine processing technology for transferring a microstructure on a mold onto a workpiece made of resin, metal, etc. has recently been developed and attracts attention (Stephan Y. Chou et al., Appl. Phys. Lett, vol. 67, issue 21, pp. 3114-3116 (1995)). This technology is referred to as nanoimprinting or nanoembossing and provides a resolution of the order of a few nanometers, and therefore, it is increasingly expected as the next-generation semiconductor manufacturing technology that replaces photolithography machines, such as steppers and scanners. Furthermore, since the technology can collectively process a three-dimensional structure at wafer level, applications to broad fields are expected as a technology for manufacturing optical elements, such as photonic crystal, and biochips of a micro total analysis system (μ-TAS) etc.

Such a processing technology is performed as follows when applied to a semiconductor manufacturing technology, for example. A work having a photo-curable resin layer on a substrate (for example, a semiconductor wafer) and a mold having a desired embossed pattern are put together, with the resin layer therebetween, the mold is pressed onto the resin, and the resin is irradiated with ultraviolet rays to cure the resin. Thus, the pattern is transferred to the resin layer. This resin layer is used as a mask layer for etching etc. to form the pattern on the substrate.

In such imprinting, U.S. Pat. No. 7,077,992 discloses a step-and-repeat method for transferring the pattern onto a substrate one by one using a mold smaller than the substrate is known as a method suitable for a semiconductor manufacturing process. This method can decrease integration errors when drawing a mold pattern with increases in size and can reduce mold manufacturing costs by setting the mold size smaller than the substrate size.

As a method suitable for forming a resin layer by the step-and-repeat method, U.S. Patent Application Publication. No. 2005/0,270,312 discloses a drop-on-demand method for depositing resin every shot. This method can make the thickness of an imprinted resin layer uniform by locally adjusting the amount of resin in accordance with the density and shape of the mold pattern, thereby improving the transfer accuracy.

However, for application to the semiconductor manufacturing technology described above it is necessary to improve the throughput. In particular, it is pointed out that the process of pressing the mold onto the resin on the substrate takes very much time. Furthermore, it is also pointed out that the process of depositing resin every shot by the drop-on-demand method takes very much time.

Thus, U.S. Patent Application Publication No. 2007/0,102,838 discloses a method for performing the process of pressing the mold onto the resin and the process of depositing the resin at the same time using two substrate stages and a method for using two resin depositing units.

However, since manufacture of substrate stages costs more than that of other mechanisms, the apparatus having two substrate stages, as in U.S. Patent Application Publication No. 2007/0,102,838, has the issue of increasing the cost. The method of using two resin depositing units deposits resin only while the substrate stage moves, in which the process of pressing the mold onto the resin and the process of depositing the resin are performed at different times. Therefore, this may have not so good effect for high throughput.

SUMMARY OF THE INVENTION

The present invention performs the process of imprinting by pressing the mold onto the resin and the process of depositing the resin in parallel. Thus, the present invention can provide an imprinting apparatus and an imprinting method capable of providing higher throughput.

According to a first aspect of the present invention, there is provided an imprinting apparatus that transfers a pattern of a mold to a resin on a substrate. The imprinting apparatus includes a deposition mechanism configured to deposit the resin onto the substrate; a first driving mechanism configured to change a relative position, on a plane parallel to the surface of the substrate, of the substrate and the mold; a second driving mechanism configured to change the relative position, on a plane parallel to the surface of the substrate, of the substrate and the deposition mechanism; and a control unit configured to control the deposition mechanism and the driving mechanism so as to perform a resin deposition process of depositing the resin onto the substrate and an imprint process of transferring the pattern of the mold to the resin on the substrate in parallel.

According to a second aspect of the present invention, there is provided an imprinting apparatus that transfers a pattern of a mold to a resin on a substrate. The imprinting apparatus includes a deposition mechanism configured to deposit a necessary amount of the resin for one imprint process onto the substrate at a time; a driving mechanism configured to change a relative position of the substrate and the mold in a direction perpendicular to the surface of the substrate; and a control unit configured to control the deposition mechanism and the driving mechanism so as to perform a resin deposition process of depositing the resin onto the substrate and an imprint process of transferring the pattern of the mold to the resin on the substrate in parallel.

According to a third aspect of the present invention, there is provided an imprinting method for transferring a pattern of a mold onto a resin on a substrate. The method includes performing a resin deposition process of depositing resin on the substrate and an imprint process of transferring the pattern of the mold onto the resin on the substrate in parallel by independently changing a relative position of the mold and the substrate and a relative position of the deposition mechanism that deposits the resin and the substrate.

According to a fourth aspect of the present invention, there is provided an imprinting method for transferring a pattern of a mold onto a resin on a substrate. The method includes performing a process of depositing a necessary amount of the resin for one imprint process onto the substrate at a time and an imprint process of transferring the pattern of the mold to the resin on the substrate in parallel while keeping a relative positional relationship with the substrate.

Further features of the present invention will become apparent from the following description of exemplary embodiments with reference to the attached drawings.

BRIEF DESCRIPTION OF THE DRAWINGS

FIG. 5 is a diagram describing an example of a process flow according to the first embodiment of the present invention.

FIG. 11 is a diagram illustrating an example of an apparatus configuration according to a second embodiment of the present invention.

FIG. 13 is a diagram illustrating an example of an apparatus configuration according to a third embodiment of the present invention.

FIG. 16 is a diagram illustrating an example of the apparatus configuration according to the third embodiment of the present invention.

FIGS. 18A and 18B are diagrams illustrating an example of step-and-repeat imprint according to a fourth embodiment of the present invention.

FIGS. 19A to 19D are diagrams illustrating an example of step-and-repeat imprint according to a fifth embodiment of the present invention.

DESCRIPTION OF THE EMBODIMENTS

The present invention will be described with reference to the embodiments below.

A first embodiment of the present invention will be described in detail with reference to the drawings.

In this specification, assume that a plane parallel to a substrate surface is an x-y plane, and an axis perpendicular to the x-y plane is a z-axis. Here, the substrate surface and the plane parallel thereto are not necessarily completely parallel but have only to be substantially parallel. Assume that a rotation about the z-axis is a rotation $\theta$. The x-axis and the y-axis in this specification can be interchanged as appropriate.

Figure 1:
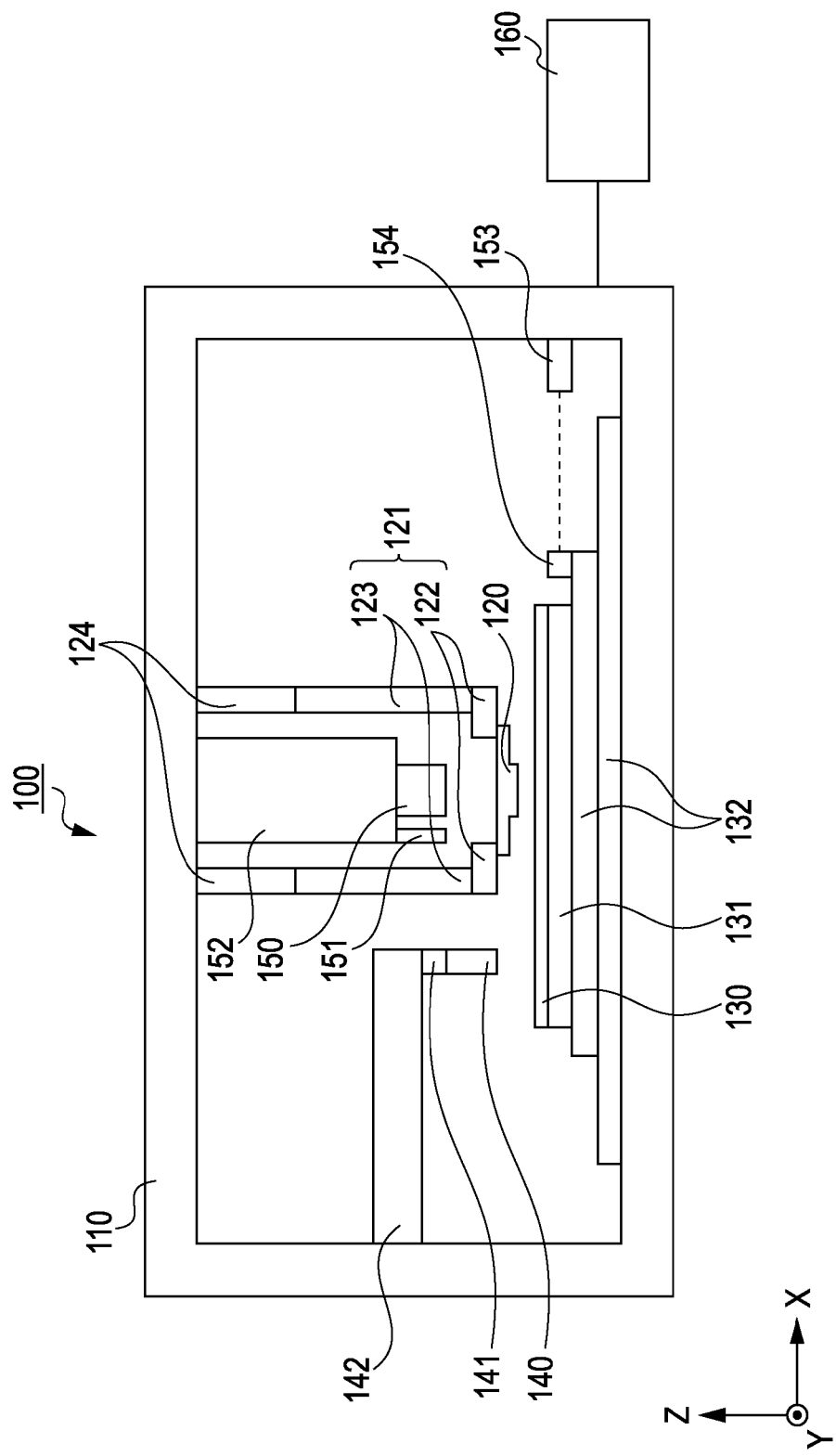
FIG. 1 is a diagram illustrating an example of an apparatus configuration according to a first embodiment of the present invention.

First, an example of the configuration of an apparatus according to this embodiment will be described with reference to FIG. 1. Reference numeral 100 denotes an imprinting apparatus. A housing 110 accommodates a mold driving unit 124, a first-resin-depositing-unit driving unit 142, a substrate stage 132, etc. The mold 120 and a substrate 130 are opposed to each other. The mold 120 is a transparent member having a desired embossed pattern on the substrate-130-side surface and is joined to the housing 110 via a mold holder 121 and the mold driving unit 124. The mold holder 121 is made up of a mold holding portion 122 and a connecting member 123. The material of the mold 120 can appropriately be selected from quarts, sapphire, titanium oxide, silicon nitride, etc. and is generally subjected to a release treatment on the substrate-130-side surface by silane coupling etc. The substrate 130 is mounted to the substrate stage 132 with a substrate holding portion 131. The substrate stage 132 is mounted on the housing 110. A first resin depositing unit 140 (deposition mechanism) is mounted to the housing 110 via a first-resin-coat-height adjusting mechanism 141 and the first-resin-depositing-unit driving unit 142 so as to be able to deposit a photo cure resin 200 to a desired location on the substrate 130.

A light irradiation mechanism 150 and a scope 151 are provided, via a member 152 at the portion of the housing 110 opposite to the pattern transfer surface of the mold 120. The light irradiation mechanism 150 radiates light having a wavelength to cure the photo cure resin 200; for example, it is a halogen lamp or a high-pressure mercury lamp that generates ultraviolet rays. The scope 151 is made up of a light source, a lens system, and a CCD camera and obtains information on the positional relationship between the mold 120 and the substrate 130. The information on the positional relationship between the substrate 130 and the housing 110 is obtained using a distance measuring unit 153 and a reference mirror 154.

A process control circuit 160 (control unit) gives instructions to the mold driving unit 124, the substrate stage 132, the first resin depositing unit 140, the first-resin-coat-height adjusting mechanism 141, the first-resin-depositing-unit driving unit 142, the light irradiation mechanism 150, the scope 151, and the distance measuring unit 153 to advance the processes thereof and receives data output therefrom.

The mold driving unit 124 operates to change the position of the mold 120 relative to the housing 110 in the direction of the z-axis. The substrate stage 132 operates to change the position of the substrate 130 relative to the housing 110 in the direction of the x-y plane. The first-resin-depositing-unit driving unit 142 operates to change the position of the first resin depositing unit 140 relative to the housing 110 in the direction of the x-y plane. The first-resin-coat-height adjusting mechanism 141 operates to change the position of the first resin depositing unit 140 relative to the housing 110 in the direction of the z-axis. The first-resin-coat-height adjusting mechanism 141 is provided as necessary. Another structure in which the first resin depositing unit 140 is mounted to the housing 110 only via the first-resin-depositing-unit driving unit 142 is applicable.

This provision of the substrate stage 132 and the first-resin-depositing-unit driving unit 142 allows the relative position in the direction of the x-y plane of the mold 120 and the substrate 130 and the relative position in the direction of the x-y plane of the first resin depositing unit 140 and the substrate 130 to be separately controlled. For example, the relative position in the x-y plane of the mold 120 and the substrate 130 can be changed by driving the substrate stage 132. Even with the substrate stage 132 standing still, the relative position in the direction of the x-y plane of the substrate 130 and the first resin depositing unit 140 can be changed by driving the first-resin-depositing-unit driving unit 142 without substantially changing the relative position of the mold 120 and the substrate 130.

"Without substantially changing the relative position" in this embodiment also includes a case in which the relative position changes sufficiently slightly relative to the size of the mold 120 and a case in which the relative position changes in the z-direction because the photo cure resin 200 fills the gap between the mold 120 and the substrate 130.

Figure 2A:
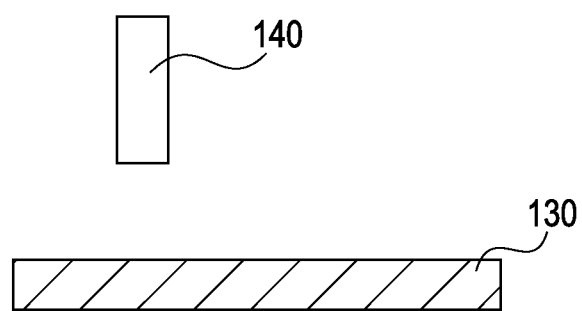
FIGS. 2A to 2C are diagrams illustrating an example of a resin deposition process according to the first embodiment of the present invention.
Figure 2B:
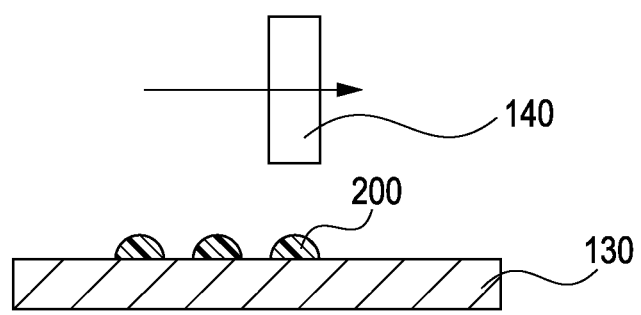
Figure 2C:
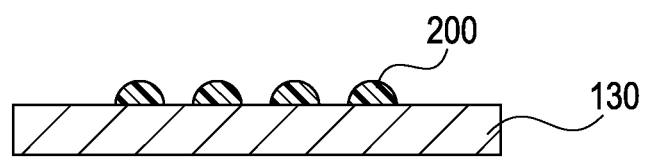

FIGS. 2A to 2C show a resin deposition process of this embodiment. Referring first to FIG. 2A, the first resin depositing unit 140 is located at a desired position on the substrate 130 using the first-resin-coat-height adjusting mechanism 141 and the first-resin-depositing-unit driving unit 142. Referring next to FIG. 2B, the photo cure resin 200 is deposited onto the substrate 130. The photo cure resin 200 is resin that can be cured by irradiation with light having a specific wavelength. Lastly, FIG. 2C shows a state in which the deposition of the photo cure resin 200 onto the substrate 130 has been completed. Examples of the photo cure resin 200 are resins that are cured at wavelengths of 248 nm and 365 nm. In the present invention, the shape and size and depositing method of the first resin depositing unit 140 are not limited. For example, the first resin depositing unit 140 may be inkjet nozzles, or alternatively, may be of another system, such as a pneumatic dispenser. In the present invention, the number of the nozzles of the resin depositing unit is not limited.

Figure 3A:
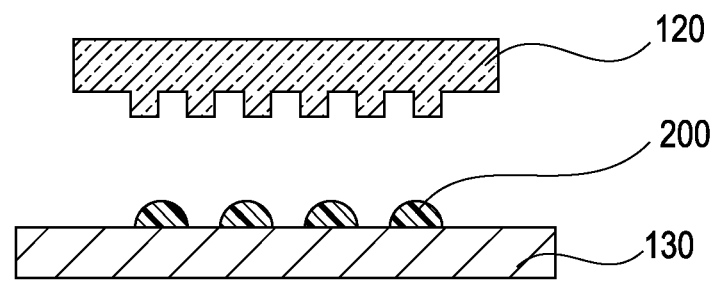
FIGS. 3A to 3C are diagrams illustrating an example of an imprint process according to the first embodiment of the present invention.
Figure 3B:
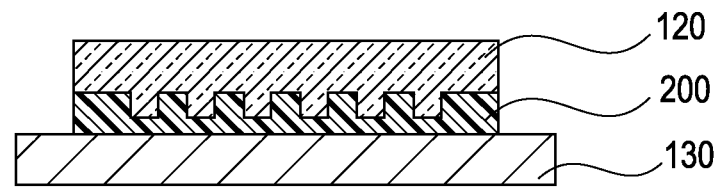
Figure 3C:
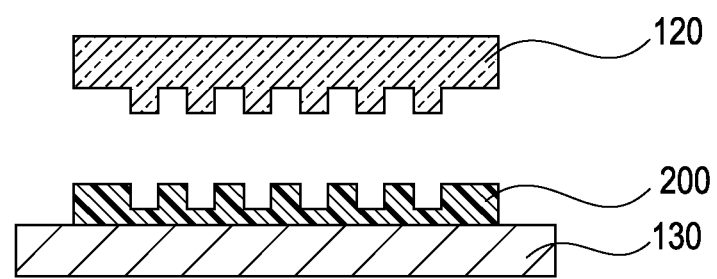

FIGS. 3A to 3C show an imprint process of this embodiment. Referring to FIG. 3A, the substrate 130 to which the photo cure resin 200 is deposited is opposed to the mold 120. Referring next to FIG. 3B, the mold 120 is pressed onto the photo cure resin 200 on the substrate 130. Next, the photo cure resin 200 between the mold 120 and the substrate 130 is cured by irradiation with light using the light irradiation mechanism 150. Thereafter, referring to FIG. 3C, the mold 120 and the substrate 130 are separated to peel the photo cure resin 200 from the mold 120. By the processes above, the embossed pattern on the surface of the mold 120 is transferred onto the photo cure resin 200 on the substrate 130. Such a series of imprinting processes of the step-and-repeat method is referred to as one shot imprint.

Figure 4A:
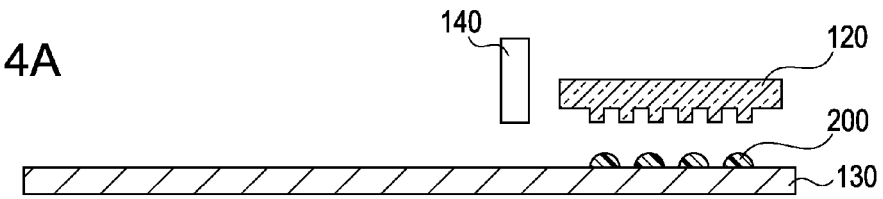
FIGS. 4A to 4F are diagrams illustrating an example of a step-and-repeat method according to the first embodiment of the present invention.
Figure 4B:
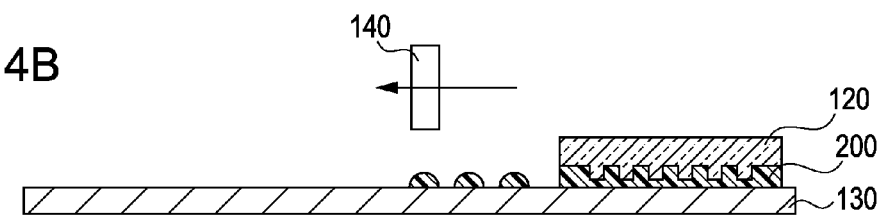
Figure 4C:
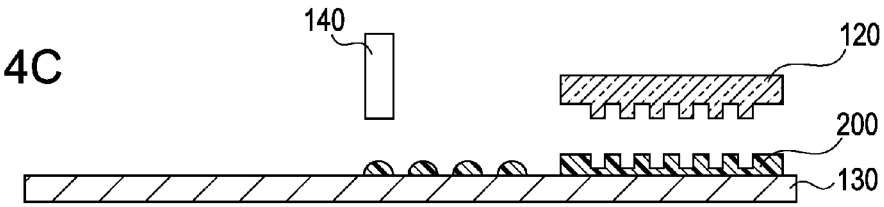
Figure 4D:
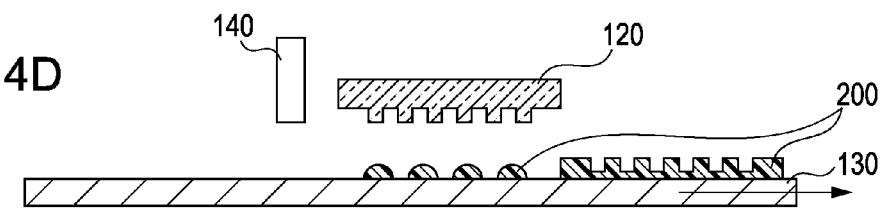
Figure 4E:
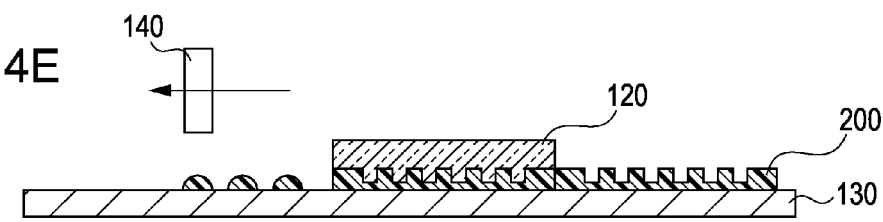
Figure 4F:
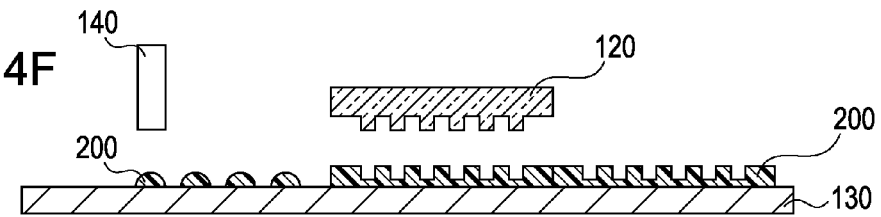

FIGS. 4A to 4F show a step-and-repeat method of this embodiment. Referring to FIG. 4A, the mold 120 and the first resin depositing unit 140 are located at desired positions on the substrate 130 using the substrate stage 132 and the first-resin-depositing-unit driving unit 142. At that time, the photo cure resin 200 has already been disposed on the substrate 130 on which the mold 120 is placed. Referring next to FIG. 4B, an imprint process is performed using the mold 120 in parallel with the resin deposition process using the first resin depositing unit 140. At that time, to move the first resin depositing unit 140 over the substrate 130, the first-resin-depositing-unit driving unit 142 is driven, with the substrate stage 130 substantially standing still in the direction of the x-y plane. FIG. 4C shows a state in which the resin deposition process and the imprint process have been completed. Referring next to FIG. 4D, the mold 120 is located, using the substrate stage 132, at a position on the substrate 130 at which the next shot imprint is to be performed, and the first resin depositing unit 140 is located at a position on the substrate 130 at which the next resin deposition process is to be performed. At that time, the relative position in the direction of the x-y plane of the mold 120 and the first resin depositing unit 140 can also be changed by driving the first-resin-depositing-unit driving unit 142. By repeating the above operations, the photo cure resin 200 to which the embossed pattern on the surface of the mold 120 is transferred can be formed over the entire area of a desired region on the substrate 130.

Referring to FIG. 4B, the relative position in the z-direction of the mold 120 and the substrate 130 can also be changed by driving the mold driving unit 124.

Referring again to FIG. 4B, suppose that the nozzles of the first resin depositing unit 140 are arranged in two dimensions in the x-y plane, so that one shot of resin can be deposited at a time. In this case, if the resin deposition process can be performed without substantially changing the relative position in the direction of the x-y plane of the first resin depositing unit 140 and the substrate 130, the first-resin-depositing-unit driving unit 142 may not be driven.

In this embodiment, the relative position in the direction of the z-axis of the mold 120 and the substrate 130 can be changed by driving the mold driving unit 124 without changing the relative position in the z-direction of the first resin depositing unit 140 and the substrate 130. This allows the resin deposition process to be performed by holding the distance in the z-direction between the first resin depositing unit 140 and the substrate 130 constant, irrespective of the operation of bringing the mold 120 and the substrate 130 close to or away from each other in the z-direction in the imprint process. This is advantageous in the case where changes in the direction in the z-direction between the first resin depositing unit 140 and the substrate 130 have an influence on the resin deposition process.

In this way, the embodiment of the present invention allows the resin deposition process to be performed in parallel with the imprint process, allowing the throughput to be increased.

In the present invention, the resin 200 deposited in the resin deposition process sometimes evaporates into the atmosphere with time. In such a case, the temporal interval between the resin deposition process and the process of imprinting the resin deposited in the resin deposition process may be always constant to keep the amount of the resin imprinted in the imprint process constant. The temporal interval between the resin deposition process and the process of imprinting the resin deposited in the resin deposition process may be short.

FIG. 5 shows a flowchart for the step-and-repeat method of this embodiment. In step S500, the step-and-repeat process is started. Step S501 is the first resin deposition process. The photo cure resin 200 is deposited onto the first-shot position on the substrate 130. Next, in step S502, the substrate stage 132 is driven to locate the mold 120 at the first-shot position, and the first resin depositing unit 140 is located at the next resin depositing position. Next, in steps S503 and S504, the resin deposition process and the imprint process are performed in parallel. Next, in step S505, it is determined whether the number of the remaining shots of the step-and-repeat process is two or more. If the number of the remaining shots is two or more (NO in step S505), then the process returns to point 506, and steps S502, S503, and S504 are repeated. If the number of the remaining shots is one (YES in step S505), then the substrate stage 132 is driven to locate the mold 120 at the last shot position in step S507. Next, in step S508, the last imprint process is performed. Lastly, in step S509, the step-and-repeat process is terminated. The process may be controlled as in this flow using the process control circuit 160.

Figure 6:
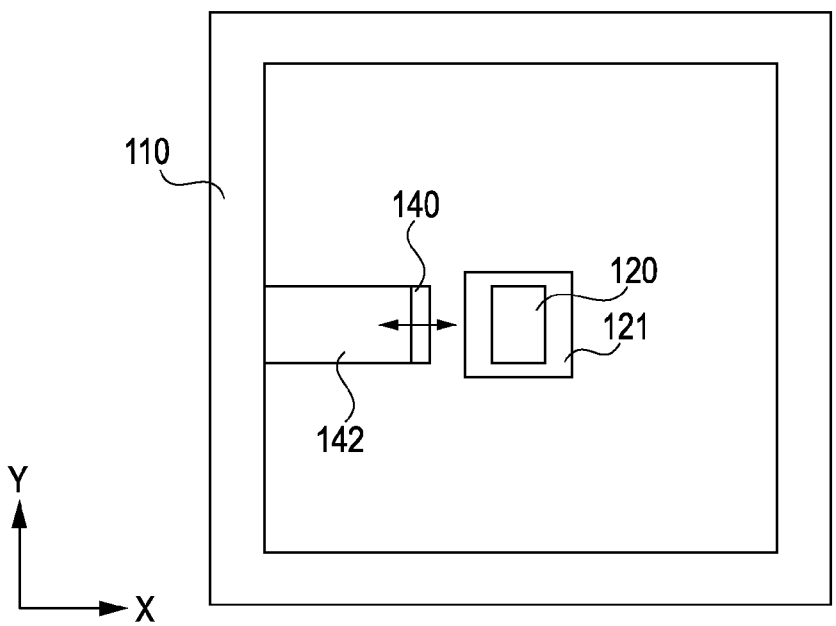
FIG. 6 is a diagram illustrating an example of the apparatus configuration according to the first embodiment of the present invention.

Next, FIG. 6 shows an example of the configuration of the driving mechanism of the first-resin-depositing-unit driving unit 142 of this embodiment. This is an example in which the first-resin-depositing-unit driving unit 142 has one driving mechanism that operates in the x-direction. This configuration can achieve the present invention using one driving mechanism, thus reducing the cost of the apparatus.

Figure 7:
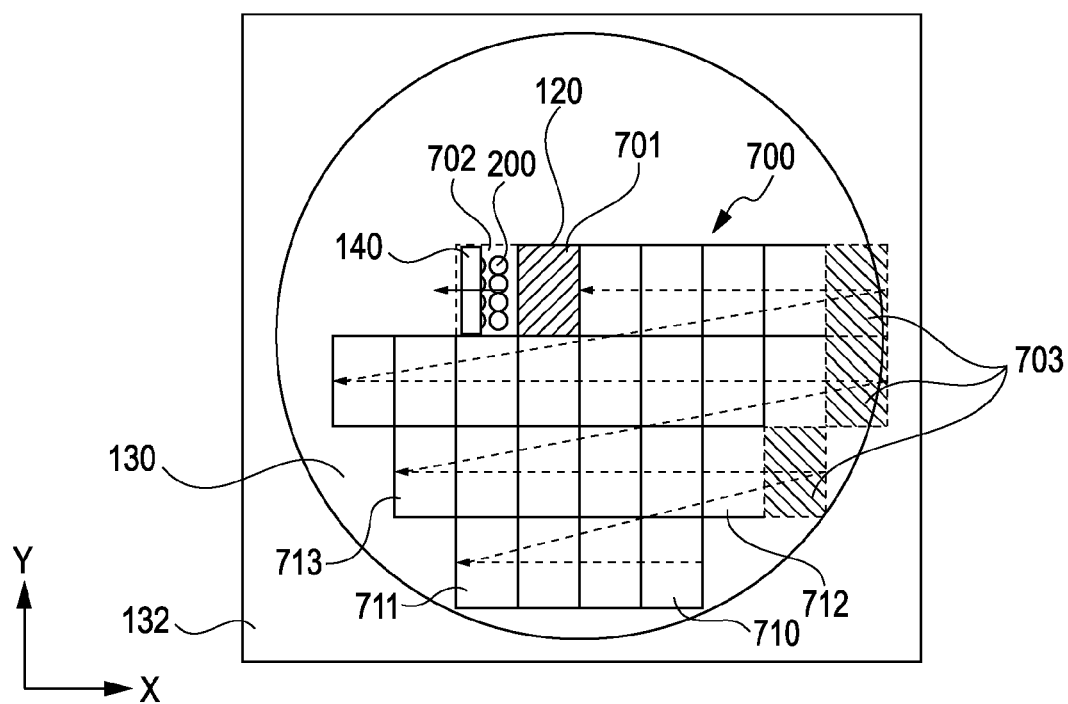
FIG. 7 is a diagram illustrating an example of the step-and-repeat imprint according to the first embodiment of the present invention.

FIG. 7 shows an example of the shot sequence of the step-and-repeat imprint using the configuration in FIG. 6 of this embodiment. Reference numeral 700 denotes a region in which a shot imprint has already been made, in which the pattern-transferred photo cure resin 200 is formed. Reference numeral 701 denotes a region in the imprint process. Reference numeral 702 denotes a region in the resin deposition process. Reference numeral 710 denotes the first shot of the step-and-repeat imprint. The step-and-repeat imprint is repeated from regions 710 to 711 in the negative direction of the x-axis. Next, a new line is started in the positive direction of the y-axis, and the imprint process is performed on region 712. Likewise, the step-and-repeat imprint is repeated up to a region 713 in the negative direction of the x-axis. A new line is repeatedly started so that pattern-transferred photo cure resins are formed on the substrate 130. When a new line is started, the mold 120 waits for a resin deposition process corresponding to the first shot of the new line at standby position 703, and thereafter, performs the imprint process on the first shot of the new line. In this way, the driving distance of the substrate stage 132 can be reduced by performing the step-and-repeat imprint on continuous locations, thereby increasing the throughput.

Figure 8A:
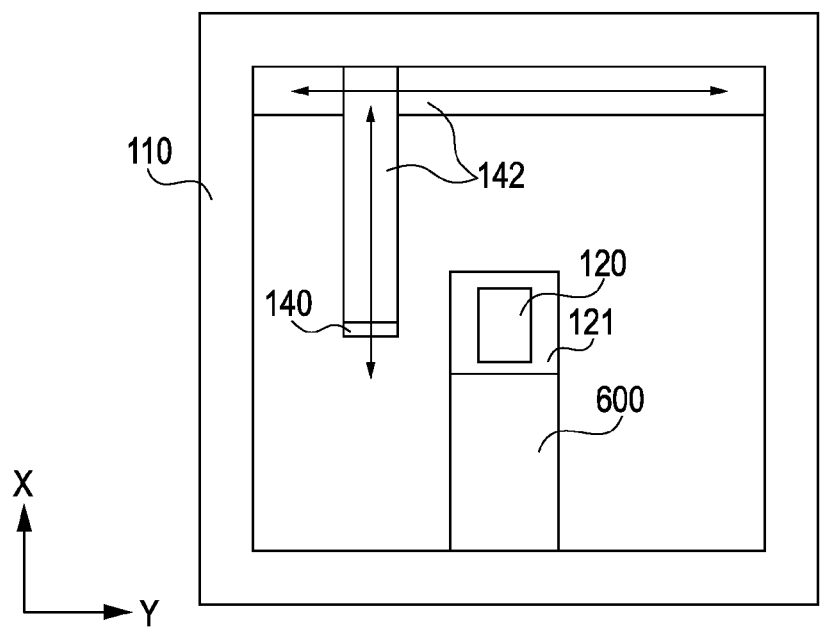
FIG. 8A is a diagram illustrating an example of the apparatus configuration according to the first embodiment of the present invention.
Figure 8B:
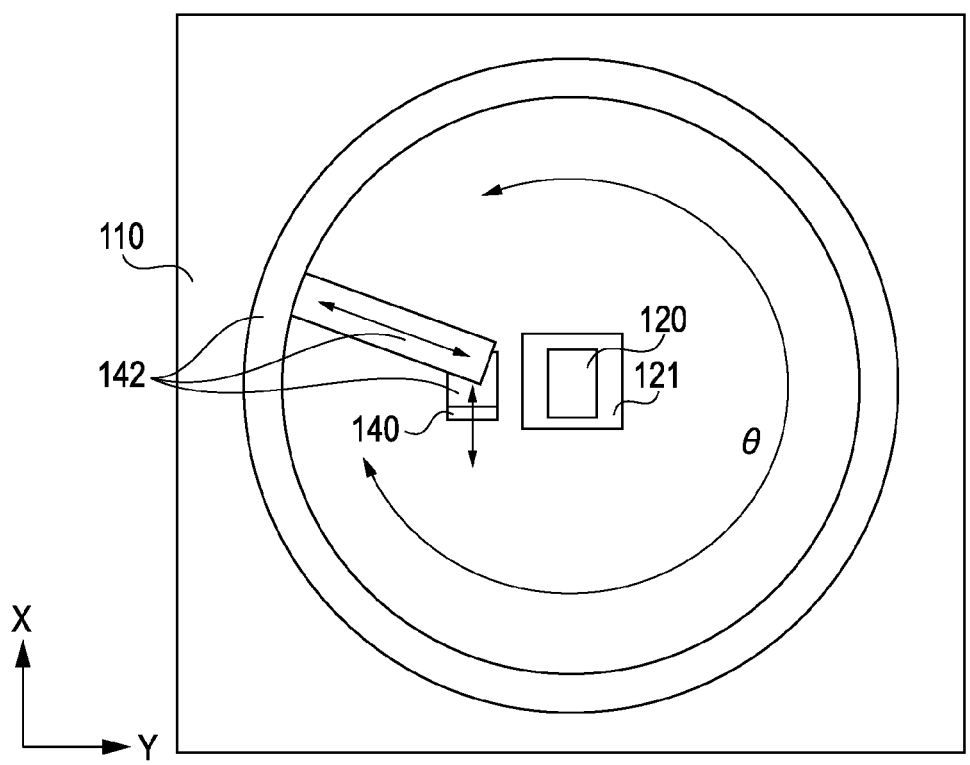
FIG. 8B is a diagram illustrating an example of the apparatus configuration according to the first embodiment of the present invention.

FIGS. 8A and 8B show other configuration examples of the driving mechanism of the first-resin-depositing-unit driving unit 142 of this embodiment. FIG. 8A shows an example in which the first-resin-depositing-unit driving unit 142 has two driving mechanisms that operate individually in the x-direction and the y-direction. This configuration allows the photo cure resin 200 to be deposited to the entire region other than a portion 600 that is hidden by the mold holding portion 121 seen from the y-direction driving mechanism only with simple driving mechanism. FIG. 8B shows an example in which the first-resin-depositing-unit driving unit 142 has four driving mechanisms. The four driving mechanisms are made up of two driving mechanisms that operate in the θ-direction and toward and away from the rotation center of the rotating arm, respectively, a rotating mechanism that adjusts the orientation of the first resin depositing unit 140, and a driving mechanism that drives the first resin depositing unit 140 in the x-direction. The two driving mechanisms of the first-resin-depositing-unit driving unit 142 operate in the θ-direction and toward and away from the rotation center of the rotating arm, respectively. Therefore, the first resin depositing unit 140 can rotate around the mold 120. This configuration allows the photo cure resin 200 to be deposited over the entire peripheral region of the mold 120 irrespective of the location of the mold holder 121.

It is not needless to say that the configurations of the mechanisms are not limited to this embodiment and another configuration is applicable. For example, it is possible to adopt a configuration in which the first-resin-depositing-unit driving unit 142 has three driving mechanisms that move in one direction individually.

Figure 9:
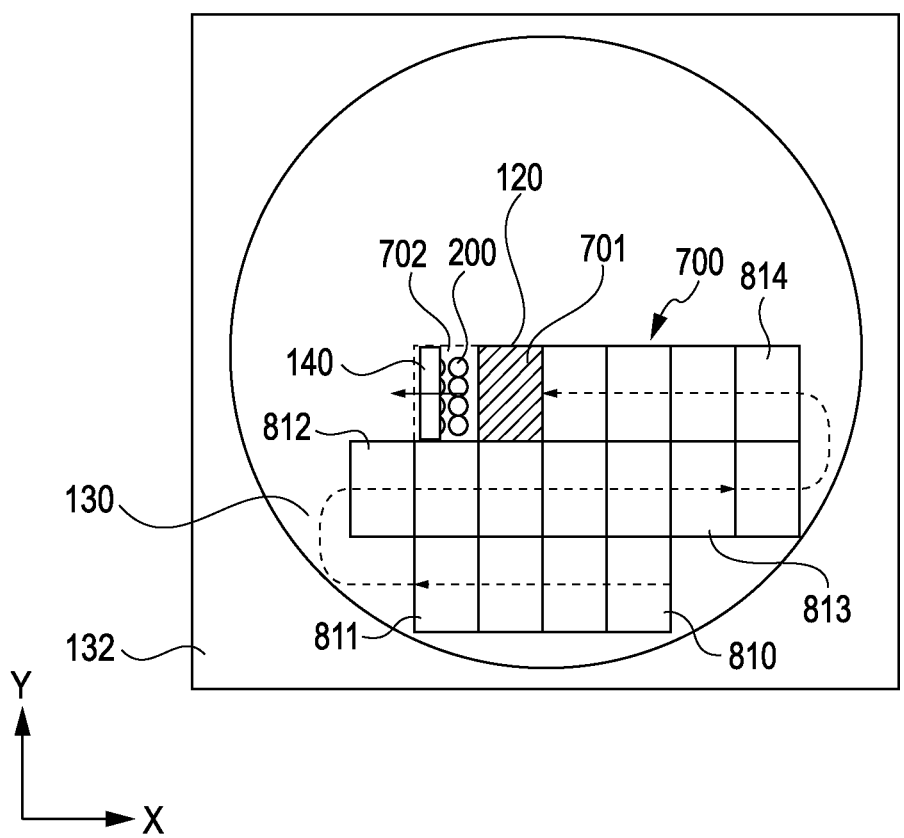
FIG. 9 is a diagram illustrating an example of the step-and-repeat imprint according to the first embodiment of the present invention.

Next, FIG. 9 shows an example of the shot sequence of the step-and-repeat imprint with the configuration in FIGS. 8A and 8B of this embodiment. Reference numeral 810 denotes the first shot of the step-and-repeat imprint. The step-and-repeat imprint is repeated from regions 810 to 811 in the negative direction of the x-axis. Next, a new line is started in the positive direction of the y-axis, and the imprint process is performed on a region 812. Likewise, the step-and-repeat imprint is repeated up to a region 813 in the positive direction of the x-axis. A new line is started again in the positive direction of the y-axis, and the imprint process is performed on a region 814. Likewise, the step-and-repeat imprint is repeated in the negative direction of the x-axis. A new line is started repeatedly so that pattern-transferred photo cure resins are formed on the substrate 130.

The configurations in FIGS. 8A and 8B allow the relative position of the mold 120 and the first resin depositing unit 140 to be interchanged, and therefore, the reciprocating motion of the substrate stage 132 in the direction of the x-axis can be reduced by performing the step-and-repeat imprint in this sequence, which decreases the total driving distance of substrate stage 132, thus increasing the throughput.

Figure 10A:
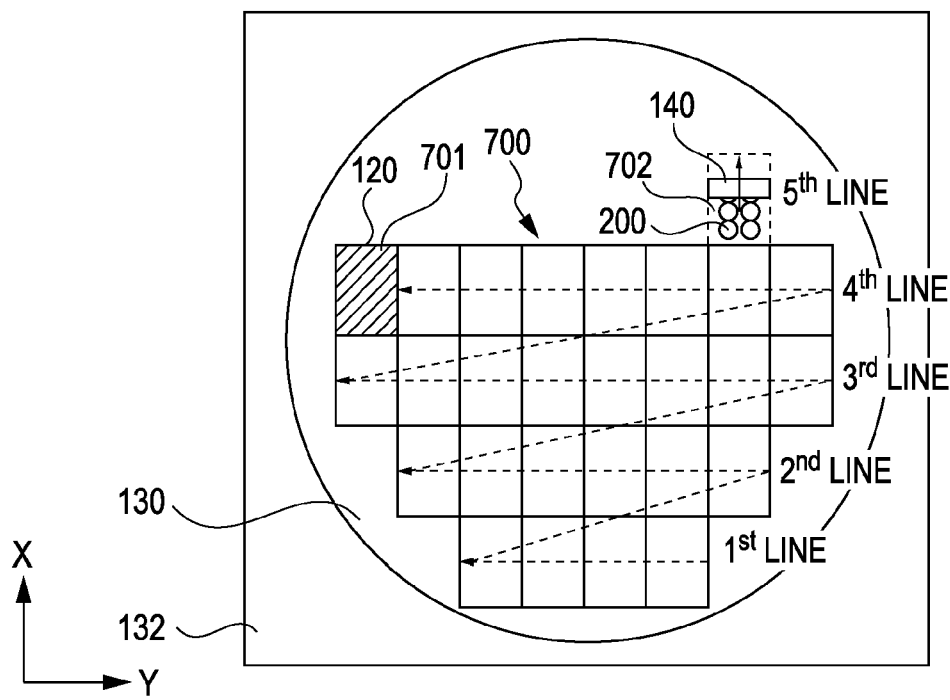
FIG. 10A is a diagram illustrating an example of the step-and-repeat imprint according to the first embodiment of the present invention.
Figure 10B:
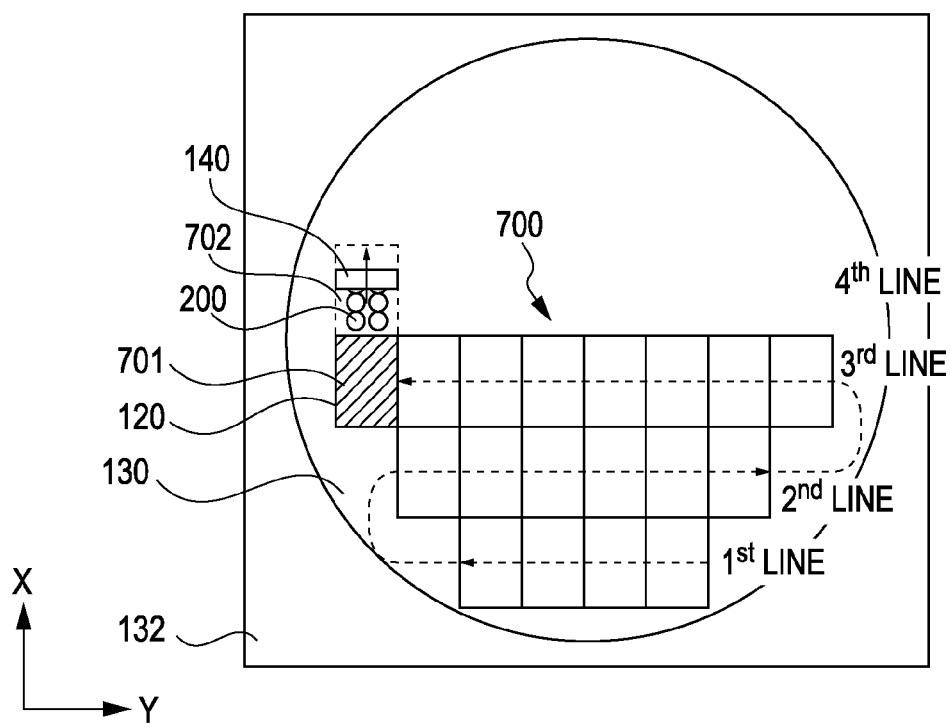
FIG. 10B is a diagram illustrating an example of the step-and-repeat imprint according to the first embodiment of the present invention.

FIGS. 10A and 10B show examples of the process sequence of the step-and-repeat imprint when a new line is started with the configurations in FIGS. 8A and 8B of this embodiment. FIG. 10A shows the relationship between the region 701 in the imprint process and the region 702 in the resin deposition process when a new line is started in the sequence of step-and-repeat imprint in FIG. 7. The first resin deposition process on the fifth line is performed in parallel with the last imprint process of the fourth line. FIG. 10B shows the relationship between the region 701 in the imprint process and the region 702 in the resin deposition process when a new line is started in the sequence of step-and-repeat imprint in FIG. 9. The first resin deposition process on the fourth line is performed in parallel with the last imprint process of the third line.

In this way, the present invention allows the resin deposition process to be performed on a line different from a line on which the imprint process is performed when a new line is started, in parallel with the imprint process, by driving the first-resin-depositing-unit driving unit 142. Therefore, the imprint process can be performed when a new line is started without waiting for the resin deposition process on the first shot of the new line, thus increasing the throughput.

In this embodiment, since the substrate stage 132 and the first-resin-depositing-unit driving unit 142 are provided, relative position in the x-y plane of the mold 120 and the substrate 130 and the relative position in the x-y plane of the first resin depositing unit 140 and the substrate 130 can be separately controlled. This allows the resin deposition process and the imprint process to be performed on the same substrate in parallel.

In the case of this embodiment, the substrate stage 132 serves as a first driving mechanism, and the first-resin-depositing-unit driving unit 142 serves as a second driving mechanism.

It is needless to say that the shot number, shot configuration, and shot sequence and the deposition sequence of resin do not limit the present invention.

It is also needless to say that the configuration and systems of the mechanisms of the present invention are not limited to this embodiment and other configurations are also applicable.

For example, the mold driving unit 124 may have a driving mechanism operating in the direction of the x-y plane. The substrate stage 132 may have a driving mechanism operating in the z-direction.

The configuration of driving units below can be adopted. A substrate stage (first driving mechanism) and a first-resin-depositing-unit driving unit (second driving mechanism) are provided as driving units. The substrate stage has a driving mechanism operating in the direction of the x-y plane and the direction of the z-axis and is disposed between the substrate holding portion and the housing 110. The first-resin-depositing-unit driving unit has a driving mechanism operating in the direction of the x-y plane and is disposed between the first resin depositing unit and the housing. Since this configuration is made up of only two driving units, the apparatus configuration is simple. Furthermore, since this configuration has no driving mechanism between the mold 120 and the housing 110, it is advantageous in the case where the scope 151 is so large that it is difficult to change the relative position of the mold 120 and the housing 110. It is also advantageous in the case where the relative position of the mold 120 and the housing 110 is substantially fixed, and the surface of the mold 120 is used as a reference surface to achieve precise alignment. Such a configuration is particularly advantageous in the case where all the above-described three advantages are needed.

Furthermore, the configuration of driving units below can be adopted. A substrate stage (first driving mechanism) and a first-resin-depositing-unit driving unit (second driving mechanism) are provided as driving units. The substrate stage has a driving mechanism operating in the directions of the x-y plane and the z-axis and is disposed between the substrate holding portion and the housing 110. The first-resin-depositing-unit driving unit has a driving mechanism operating in the x-y plane and is disposed between the first resin depositing unit and the mold holder. In this case, the first-resin-depositing-unit driving unit may have a driving mechanism operating in the direction of the z-axis. This configuration allows the relative distance in the direction of the z-axis between the mold 120 and the substrate 130 and the relative distance in the direction of the z-axis between the first resin depositing unit and the substrate 130 to be separately controlled. Therefore, this allows the resin deposition process to be performed while keeping the distance in the z-direction between the resin depositing unit and the substrate 130 constant irrespective of the operation of bringing the mold 120 and the substrate 130 close to or away from each other in the z-direction during the imprint process. This is advantageous when changes in the distance in the z-direction between the first resin depositing unit and the substrate 130 influences on the resin deposition process. Furthermore, there is no need for the first-resin-depositing-unit driving unit does to pass over the substrate from the housing when the region in the resin deposition process and the region in the imprint process are close. Therefore, the first-resin-depositing-unit driving unit can be made compact irrespective of the size of the substrate 130. This can simplify the apparatus configuration. Moreover, since this configuration has no driving mechanism between the mold 120 and the housing 110, it is advantageous in the case where the scope 151 is so large that it is difficult to change the relative position of the mold 120 and the housing 110. Furthermore, it is also advantageous in the case where the relative position of the mold 120 and the housing 110 is substantially fixed, and the surface of the mold 120 is used as a reference surface to achieve precise alignment. Such a configuration is particularly advantageous in the case where all the above-described four advantages are needed.

Furthermore, the configuration of driving units below can be adopted. A mold driving unit and a substrate stage are provided as driving units. The mold driving unit has a driving mechanism operating in the x-y plane and the direction of the z-axis and is disposed between the mold holder and the housing 110. The substrate stage has a driving mechanism operating in the direction of the x-y plane and is disposed between the substrate holding portion and the housing 110. This configuration allows the relative distance in the direction of the z-axis between the mold 120 and the substrate 130 and the relative distance in the direction of the z-axis between the first resin depositing unit and the substrate 130 to be separately controlled. Therefore, this allows the resin deposition process to be performed while keeping the distance in the z-direction between the resin depositing unit and the substrate 130 constant irrespective of the operation of bringing the mold 120 and the substrate 130 close to or away from each other in the z-direction during the imprint process. This is advantageous when changes in the distance in the z-direction between the first resin depositing unit and the substrate 130 influences on the resin deposition process.

In this case, the mold driving unit serves as a first driving mechanism, and the substrate stage serves as a second driving mechanism.

Furthermore, the configuration of driving units below can be adopted. A mold driving unit and a first-resin-depositing-unit driving unit are provided as driving units. The mold driving unit has a driving mechanism operating in the x-y plane and the direction of the z-axis and is disposed between the mold holder and the housing 110. The first-resin-depositing-unit driving unit has a driving mechanism operating in the x-y plane and is disposed between the first resin depositing unit and the mold holder. In this case, the first-resin-depositing-unit driving unit may have a driving mechanism operating in the direction of the z-axis. This configuration does not move the substrate 130 with respect to the housing 110; therefore, it is particularly advantageous in the case where the substrate is large, thus posing the problem of the size of the apparatus. Furthermore, this is advantageous in the case where the relative position of the mold 120 and the housing 110 is substantially fixed, and the surface of the substrate 130 is used as a reference surface to achieve precise alignment. Furthermore, there is no need for the first-resin-depositing-unit driving unit to pass over the substrate 30 from the housing 110 in the case where the region in the resin deposition process and the region in the imprint process are close. Therefore, the first-resin-depositing-unit driving unit can be made compact irrespective of the size of the substrate 130. This can simplify the apparatus configuration. Such a configuration is particularly advantageous in the case where all the above-described three advantageous are needed.

In this case, the mold driving unit serves as a first driving mechanism, and the first-resin-depositing-unit driving unit serves as a second driving mechanism.

Furthermore, the configuration of driving units below can be adopted. A mold driving unit (first driving mechanism) and a first-resin-depositing-unit driving unit (second driving mechanism) are provided as driving units. The mold driving unit has a driving mechanism operating in the direction of the x-y plane and in the direction of the z-axis and is disposed between the mold holder and the housing 110. The first-resin-depositing-unit driving unit has a driving mechanism operating in the direction of the x-y plane and is disposed between the first resin depositing unit and the housing 110. In this case, the first-resin-depositing-unit driving unit may have a driving mechanism operating in the direction of the z-axis. This configuration does not move the substrate with respect to the housing 110; therefore, it is particularly advantageous in the case where the substrate is large, posing the problem of the size of the apparatus. Furthermore, this is effective in the case where the relative position of the mold 120 and the housing 110 is substantially fixed, and the surface of the substrate 130 is used as a reference surface to achieve precise alignment. Such a configuration is particularly effective to achieve all the above-described two advantages.

The mold holder 121 and the substrate holding portion 131 may have a mechanism for aligning the surface of the mold 120 and the surface of the substrate 130.

The driving mechanisms in this embodiment may include mechanisms for rotation in the θ-direction and about the x-axis or the y-axis as appropriate.

In this embodiment, photo cure resin is used as the resin; however, it is needless to say that another resin material can also be used. For example, the present invention is also applicable to the case of thermoplastic resin or thermosetting resin when using heat instead of light.

A second embodiment of the present invention will be described in detail with reference to the drawings. Since the difference from the first embodiment is the configuration of the apparatus, only the difference will be described.

First, the apparatus configuration of this embodiment will be described with reference to FIG. 11. The difference from the first embodiment is the location of the first resin depositing unit 140. The first resin depositing unit 140 is mounted to the mold holder 121 via the first-resin-coat-height adjusting mechanism 141 and the first-resin-depositing-unit driving unit 142 so as to be able to deposit the photo cure resin 200 to a desired location on the substrate 130.

Figure 12A:
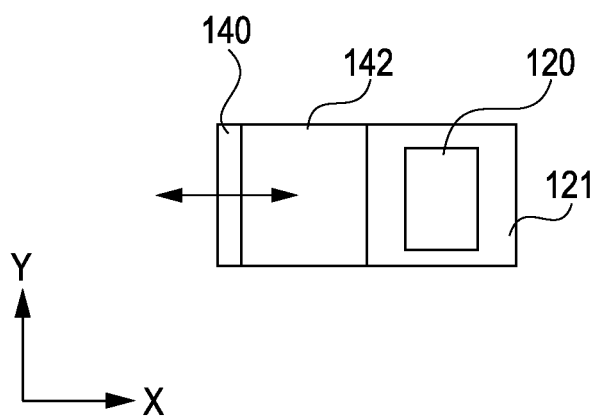
FIG. 12A is a diagram illustrating an example of the apparatus configuration according to the second embodiment of the present invention.
Figure 12B:
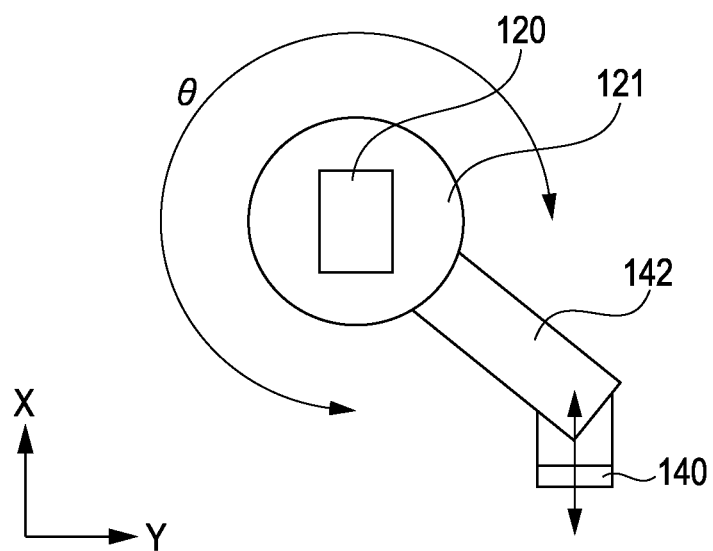
FIG. 12B is a diagram illustrating an example of the apparatus configuration according to the second embodiment of the present invention.

Next, a configuration example of the driving mechanism of the first-resin-depositing-unit driving unit 142 of this embodiment is shown in FIGS. 12A and 12B. FIG. 12A shows an example in which the first-resin-depositing-unit driving unit 142 has one driving mechanism that operates in the direction of the x-axis. This configuration can reduce the cost of the apparatus because the present invention can be achieved using one driving mechanism. The use of this configuration allows the step-and-repeat imprint shown in FIG. 7 to be performed. FIG. 12B shows an example in which the first-resin-depositing-unit driving unit 142 has four driving mechanisms. The four driving mechanisms are made up of two driving mechanisms that operate in the θ-direction and toward and away from the rotation center of the rotating arm, a rotating mechanism that adjusts the orientation of the first resin depositing unit 140, and a driving mechanism that drives the first resin depositing unit 140 in the x-direction. The first resin depositing unit 140 can rotate around the mold 120. This configuration allows the photo cure resin 200 to be deposited over the entire peripheral region of the mold 120 irrespective of the location of the mold holder 121. The use of this configuration also allows the step-and-repeat imprint shown in FIGS. 9, 10A, and 10B to be performed.

This embodiment eliminates the need for the first-resin-depositing-unit driving unit 142 to pass over the substrate 130 from the housing 110. Therefore, the first-resin-depositing-unit driving unit 142 can be made compact irrespective of the size of the substrate 130 in the case where the region in the resin deposition process and the region in the imprint process are close. This can simplify the apparatus configuration.

A third embodiment of the present invention will be described in detail with reference to the drawings. Since the difference from the first embodiment is the configuration of the apparatus and the step-and-repeat method, only the difference will be described.

First, an example of the apparatus configuration of this embodiment will be described with reference to FIG. 13. The difference from the first embodiment is that a second resin depositing unit 143 is provided. The first resin depositing unit 140 is mounted to the housing 110 via the first-resin-coat-height adjusting mechanism 141 and the first-resin-depositing-unit driving unit 142 so as to be able to deposit the photo cure resin 200 to a desired location on the substrate 130. The second resin depositing unit 143 is mounted to the housing 110 via a second-resin-coat-height adjusting mechanism 145 and a second-resin-depositing-unit driving unit 144 so as to be able to deposit the photo cure resin 200 to a desired location on the substrate 130.

Figure 14A:
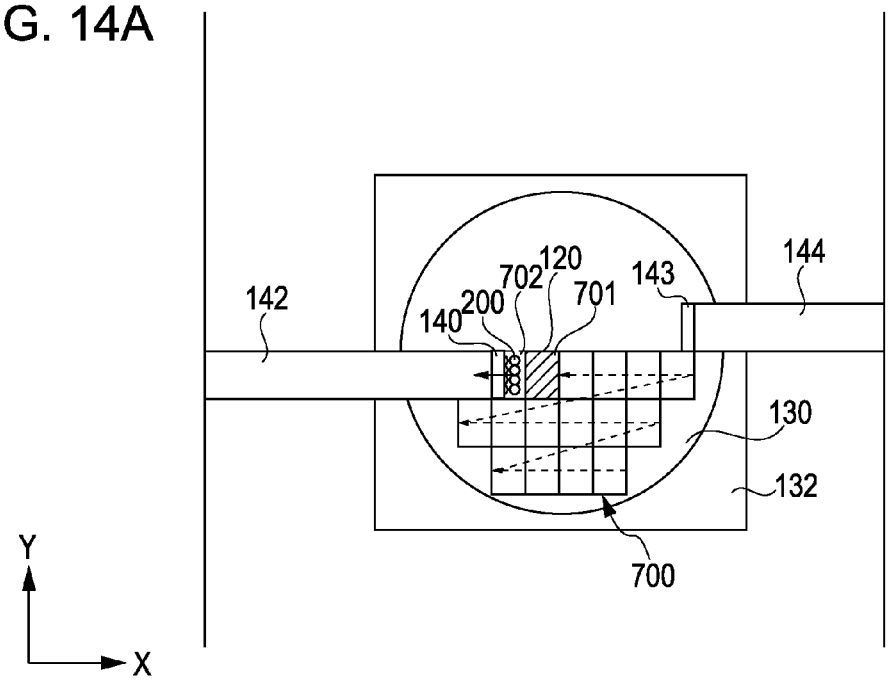
FIG. 14A is a diagram illustrating an example of the step-and-repeat imprint according to the third embodiment of the present invention.
Figure 14B:
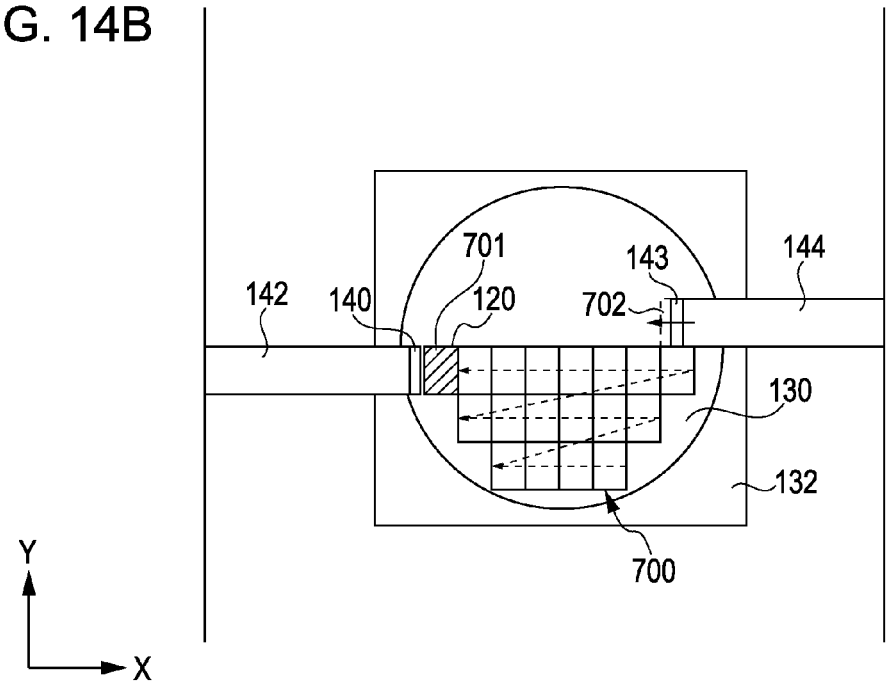
FIG. 14B is a diagram illustrating an example of the step-and-repeat imprint according to the third embodiment of the present invention.

Next, a configuration example of the driving mechanisms of the first-resin-depositing-unit driving unit 142 and the second-resin-depositing-unit driving unit 144 and an example of the step-and-repeat imprint of this embodiment are shown in FIGS. 14A and 14B. This is an example in which the first-resin-depositing-unit driving unit 142 and the second-resin-depositing-unit driving unit 144 each have one driving mechanism that operates in the direction of the x-axis. The location in the direction of the y-axis of the first resin depositing unit 140 is set so as to allow resin to be deposited in the negative direction of the x-axis from the mold 120. The location in the direction of the y-axis of the second resin depositing unit 143 is set so as to allow resin to be deposited to a location one shot off from the mold 120 in the positive direction of the y-axis. In this example, the sequence of the step-and-repeat imprint is the same as that of the step-and-repeat imprint in FIG. 7. In FIG. 14A, the step-and-repeat imprint is performed in the negative direction of the x-axis. In this case, the resin deposition process is shifted to the region 702 in the negative direction of the x-axis from the mold 120 using the first resin depositing unit 140. Next, FIG. 14B shows the relationship between the region 701 in the imprint process and the region 702 in the resin deposition process when a new line is started. The first resin deposition process on the fourth line is performed using the second resin depositing unit 143 in parallel with the last imprint process on the third line.

In this way, this embodiment allows the resin deposition process to be performed on a line different from a line in the imprint process when a new line is started, in parallel with the imprint process, using the plurality of resin depositing units. This allows the imprint process to be performed when a new line is started without waiting for a resin deposition process on the first shot of the new line, thus increasing the throughput.

Figure 15A:
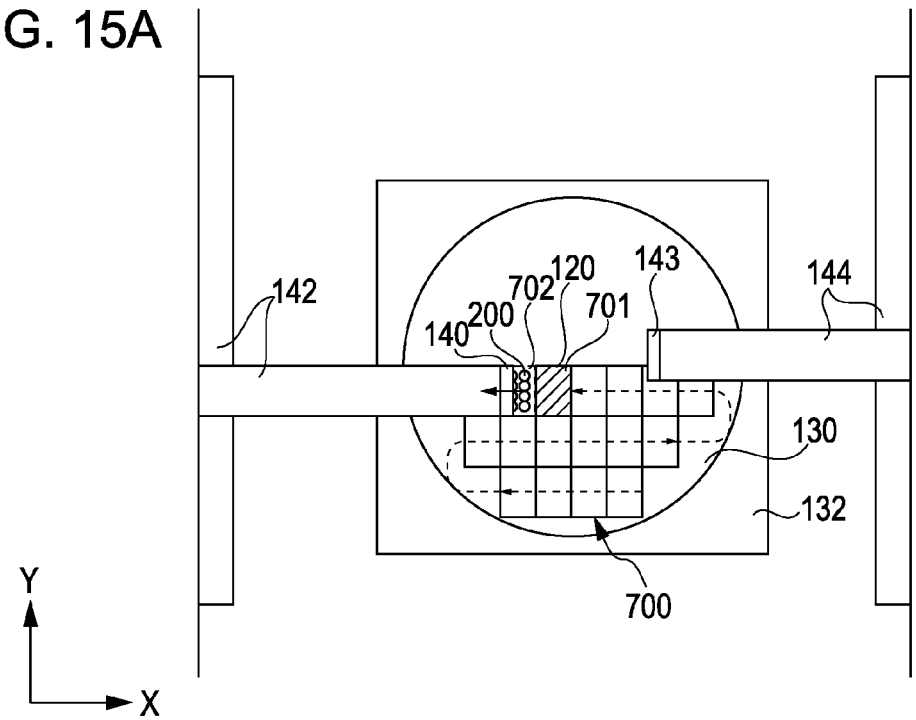
FIG. 15A is a diagram illustrating an example of the step-and-repeat imprint according to the third embodiment of the present invention.
Figure 15B:
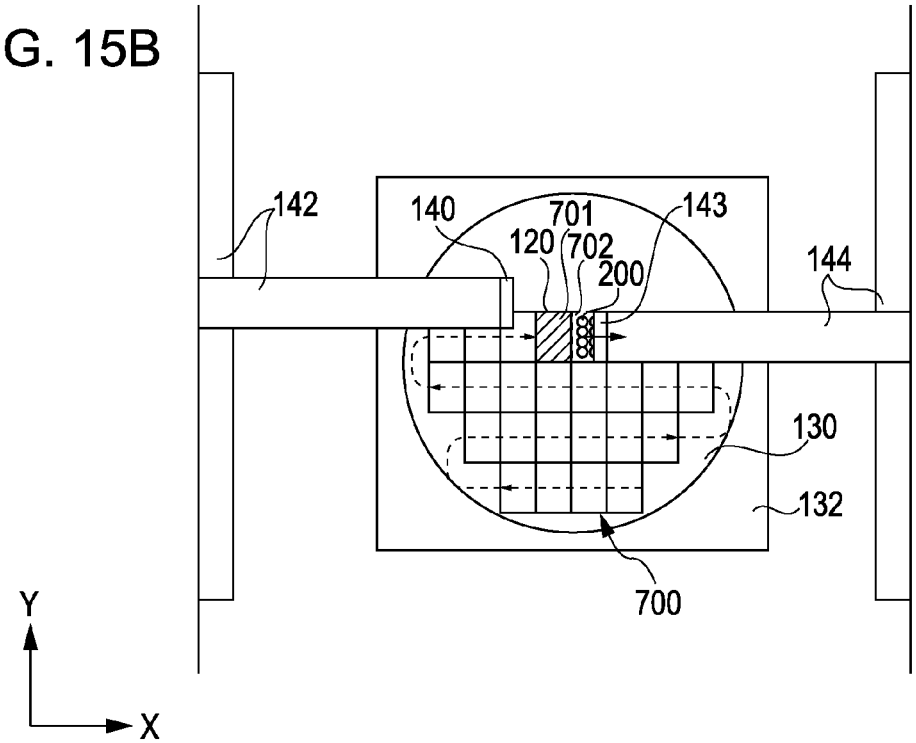
FIG. 15B is a diagram illustrating an example of the step-and-repeat imprint according to the third embodiment of the present invention.

Next, another configuration example of the driving mechanisms of the first-resin-depositing-unit driving unit 142 and the second-resin-depositing-unit driving unit 144 and another example of the step-and-repeat imprint of this embodiment are shown in FIGS. 15A and 15B. This is an example in which the first-resin-depositing-unit driving unit 142 and the second-resin-depositing-unit driving unit 144 each have two driving mechanisms that operate in the x-direction and the y-direction, respectively. With such a configuration, the driving units 142 and 144 are disposed at positions away from each other by a rotation angle between 90° and 270° about the mold holder 121, so that the step-and-repeat imprint can be performed over the entire region on the substrate 130 irrespective of the location of the mold holder 121. In this example, the shot sequence of the step-and-repeat imprint is the same as that shown in FIG. 9. In FIG. 15A, the step-and-repeat imprint is performed repeatedly in the negative direction of the x-axis using the first resin depositing unit 140. Next, in FIG. 15B, the step-and-repeat imprint is performed repeatedly in the positive direction of the x-axis using the second resin depositing unit 143.

By performing the step-and-repeat imprint in this way, the imprint process can be performed continuously irrespective of the driving time when a new line is started even if the driving speeds of the first-resin-depositing-unit driving unit 142 and the second-resin-depositing-unit driving unit 144 in the direction of the y-axis are low. Moreover, since the reciprocating motion in the direction of the y-axis of the substrate stage 132 can be reduced, the total driving distance of substrate stage 132 can be decreased, and thus, the throughput can be increased.

Next, another example of the configuration of the apparatus of this embodiment will be described with reference to FIG. 16. The difference from the second embodiment is that the second resin depositing unit 143 is provided. The first resin depositing unit 140 is mounted to the mold holder 121 via the first-resin-coat-height adjusting mechanism 141 and the first-resin-depositing-unit driving unit 142 so as to be able to deposit the photo cure resin 200 to a desired location on the substrate 130. The second resin depositing unit 143 is mounted to the mold holder 121 via the second-resin-coat-height adjusting mechanism 145 and the second-resin-depositing-unit driving unit 144 so as to be able to deposit the photo cure resin 200 to a desired position on the substrate 130.

With such an apparatus configuration, as in the step-and-repeat imprint in FIGS. 15A and 15B, the step-and-repeat imprint in the negative direction of the x-axis is performed using the first resin depositing unit 140, and the step-and-repeat imprint in the positive direction of the x-axis is performed using the second resin depositing unit 143. This can reduce the reciprocating motion in the direction of the y-axis of the substrate stage 132 even if the first-resin-depositing-unit driving unit 142 and the second-resin-depositing-unit driving unit 144 have no large-scale driving mechanism. This can reduce the total driving distance, thus decreasing the throughput.

The configurations of the mechanisms are not limited to this embodiment and another configuration is applicable. For example, it is also possible to adopt a configuration in which the first-resin-depositing-unit driving unit 142 and the second-resin-depositing-unit driving unit 144 each have three or more driving mechanisms each operating in one direction.

Figure 17A:
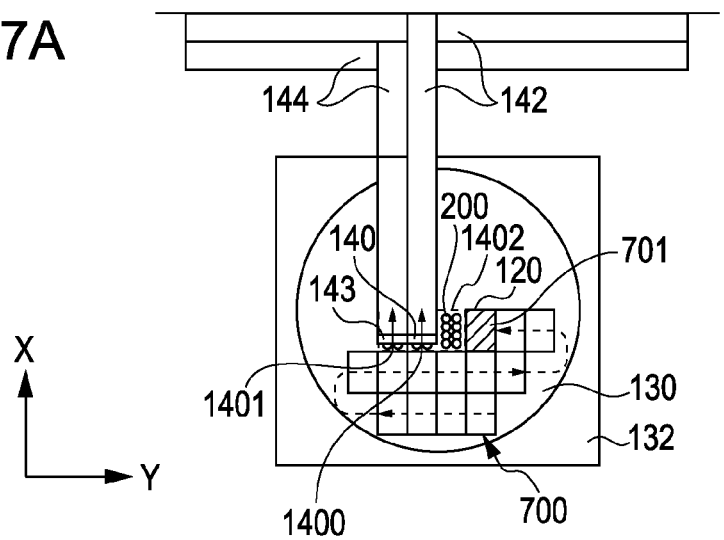
FIGS. 17A to 17C are diagrams illustrating an example of the step-and-repeat imprint according to the third embodiment of the present invention.
Figure 17B:
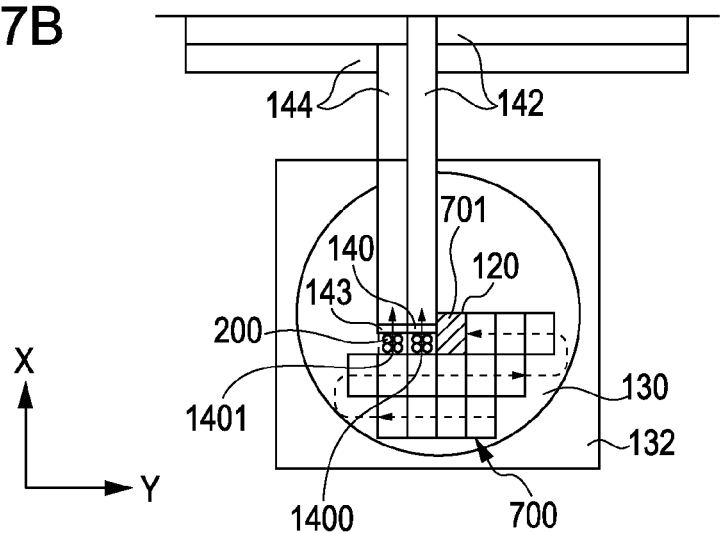
Figure 17C:
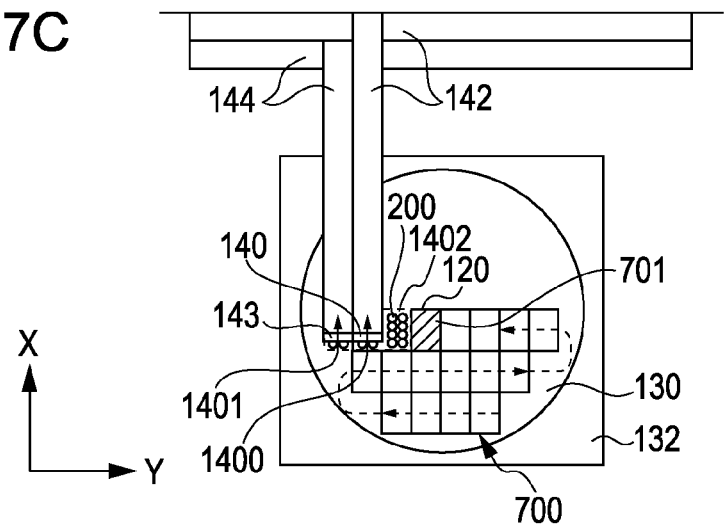

Next, another example of the step-and-repeat imprint of this embodiment is shown in FIGS. 17A to 17C. Reference numeral 1400 denotes a first resin deposition region that is being subjected to the resin deposition process by the first resin depositing unit 140. Reference numeral 1401 denotes a second resin deposition region that is being subjected to the resin deposition process by the second resin depositing unit 143. Reference numeral 1402 denotes a resin deposited region in which deposition of the photo cure resin 200 has been completed. Referring to FIG. 17A, the imprint process, the resin deposition process by the first resin depositing unit 140, and the resin deposition process by the second resin depositing unit 143 are performed in parallel. In the resin deposited region 1402, deposition of the photo cure resin 200 has already been completed. Referring next to FIG. 17B, the mold 120 is shifted to the next shot position on the substrate 130 by driving the substrate stage 132 from the state shown in FIG. 17A. At that time, the first-resin-depositing-unit driving unit 142 and the second-resin-depositing-unit driving unit 144 are driven so that the first resin depositing unit 140 and the second resin depositing unit 143 can continue the resin deposition process in the same regions. The imprint process, the resin deposition process by the first resin depositing unit 140, and the resin deposition process by the second resin depositing unit 143 are performed in parallel. Next, referring to FIG. 17C, the first resin depositing unit 140 and the second resin depositing unit 143 individually perform the resin deposition process on new portions in parallel with the imprint process on the regions to which the photo cure resin 200 were deposited in FIGS. 17A and 17B.

Suppose the step-and-repeat imprint is performed when a new line is started, as shown in FIGS. 10A and 10B. The first resin depositing unit 140 and the second resin depositing unit 143 have the first-resin-depositing-unit driving unit 142 and the second-resin-depositing-unit driving unit 144, respectively. This allows the resin deposition process to be performed on a new line with only one of the first resin depositing unit 140 and the second resin depositing unit 143.

Such a method can be performed using either the apparatus configuration shown in FIG. 13 or the apparatus configuration shown in FIG. 16. An example of the case of the apparatus configuration shown in FIG. 13 is shown in FIGS. 17A to 17C. As shown in FIGS. 17A to 17C, there may be a configuration in which the first resin depositing unit 140 and the second resin depositing unit 143 are mounted to the housing 110 with the first-resin-depositing-unit driving unit 142 and the second-resin-depositing-unit driving unit 144 extending in the same direction. In this case, their respective driving mechanisms operating in the direction of the x-y plane may be disposed in positions shifted in the direction of the z-axis so as to be able to separately move in the x-y plane. An example of the case of the apparatus configuration shown in FIG. 16 is a configuration in which driving mechanisms in the direction of the x-y plane are disposed so that the first-resin-depositing-unit driving unit 142 and the second-resin-depositing-unit driving unit 144 can separately rotate around the mold holder 121. In this case, their respective driving mechanisms in the direction of the x-y plane may be disposed in positions shifted in the direction of the z-axis so that the first resin depositing unit 140 and the second resin depositing unit 143 can separately move in the x-y plane. It is needless to say that the driving mechanisms may adopt other dispositions.

In this way, the use of two resin depositing units allows two shots of the resin deposition process to be performed in parallel during one imprint process. Therefore, even if the time taken for the resin deposition process is longer than that for the imprint process, the step-and-repeat imprint can be performed without waste time between shot imprints.

As shown in FIGS. 15A and 15B, the use of this embodiment allows the resin deposition process to be performed on the entire region on the substrate 130 even if the first-resin-depositing-unit driving unit 142 and the second-resin-depositing-unit driving unit 144 have no complicated driving mechanism.

The use of this embodiment also allows the step-and-repeat imprint to be performed irrespective of the time taken for the resin deposition process even if the time taken for the resin deposition process is twice as long as the time taken for the imprint process, thus increasing the throughput.

It is needless to say that even if the time taken for the resin deposition process is longer than twice of the time taken for the imprint process, the number of resin depositing units may be increased as in the above.

A fourth embodiment of the present invention will be described in detail with reference to the drawings. Since the difference from the first embodiment is the step-and-repeat method, only the difference will be described.

The step-and-repeat imprint of this embodiment is shown in FIGS. 18A and 18B. Reference numerals 1500, 1501, 1502, and 1503 denote regions to which the shot imprint is performed. Referring to FIG. 18A, the region 1500 is a region currently in the imprint process. The region 1501 is a region on which the next shot imprint is to be performed. The region 1502 is a region in the resin deposition process. This region is to be subjected to the imprint process after two shot imprints. Referring next to FIG. 18B, the region 1501 is a region in the imprint process. The region 1502 is a region on which the next shot imprint is to be performed. The region 1503 is a region in the resin deposition process, on which the imprint process after two shot imprints is to be performed. In this way, the step-and-repeat imprint is repeated by performing the resin deposition process on the portion after two shots in parallel with the imprint process. That is, the $N^{th}$ imprint process and the $N+M^{th}$ (M is 2 or greater) resin deposition process are performed in parallel.

The step-and-repeat method of this embodiment does not perform the resin deposition process on a region next to a region in the imprint process, in parallel with the imprint process. This allows pattern-transferred photo cure resins formed in the individual shots to be arranged with no gap therebetween without spatial interference between the mold holder 121 and the first resin depositing unit 140. This is advantageous in the case where the width in the direction of the x-y plane of the mold holder 121 is larger than the width in the direction of the x-y plane of the mold 120. This is also advantageous in the case where the mold 120 and the first resin depositing unit 140 must have a sufficient distance therebetween because of circumstances such as when a member around the mold 120 is large.

Furthermore, it is also possible to perform the resin deposition process after three shots or more in parallel with the current imprint process depending on a distance that is necessary between the mold 120 and the first resin depositing unit 140.

Furthermore, while this embodiment has been described about the case of performing the resin deposition process in the x-direction after two shots or more, the resin deposition process after two lines or more can also be performed in the y-direction.

While this embodiment has been described about the case of one resin depositing unit, the invention is also applicable to the case of two or more resin depositing units, as in the third embodiment, by performing the resin deposition process after two shots or more with their respective resin depositing units.

A fifth embodiment of the present invention will be described in detail with reference to the drawings. Since the difference from the first embodiment is the step-and-repeat method, only the difference will be described.

The step-and-repeat imprint of this embodiment is shown in FIGS. 19A to 19D. Reference numerals 1600, 1601, 1602, 1603, 1604, and 1605 denote regions on which imprinting is to be performed. Referring to FIG. 19A, the region 1600 is a region in the imprint process; the region 1602 is a region in the resin deposition process; and the region 1601 is a region corresponding to one shot imprint, with this region skipped, the photo cure resin 200 is being deposited to the region 1602.

Referring next to 19B, the region 1600 is a region in which the pattern-transferred photo cure resin 200 has already been formed; the region 1602 is a region in the imprint process; and the region 1604 is a region in the resin deposition process. The process of step-and-repeat imprint while skipping one shot imprint of region in this way is referred to as a first repeat process. Referring to FIG. 19C, the regions 1600, 1602, and 1604 are regions in which the pattern-transferred photo cure resin 200 has already been formed in the first repeat process; the region 1601 is a region in which one shot imprint is skipped in the first repeat process and is now in the imprint process; and the region 1603 is also a region in which one shot imprint is skipped in the first repeat process and is now in the imprint process. Referring to FIG. 19D, the regions 1600, 1601, 1602, and 1604 are regions in which the pattern-transferred photo cure resin 200 has already been formed; the region 1603 is a region in which one shot imprint is skipped in the first repeat process and is now in the imprint process; and the region 1605 is a region in which one shot imprint is skipped in the first repeat process and is now in the resin deposition process. The process of step-and-repeat imprint in the region that is skipped in the first repeat process in this way is referred to as a second repeat process.

Figure 20A:
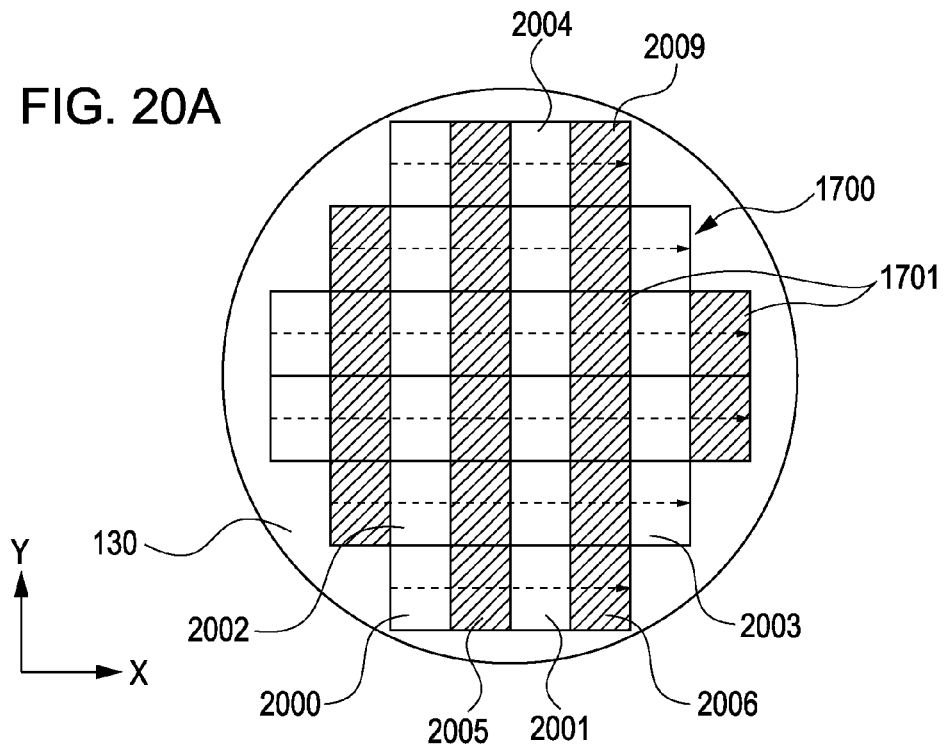
FIG. 20A is a diagram illustrating an example of the step-and-repeat imprint according to the fifth embodiment of the present invention.
Figure 20B:
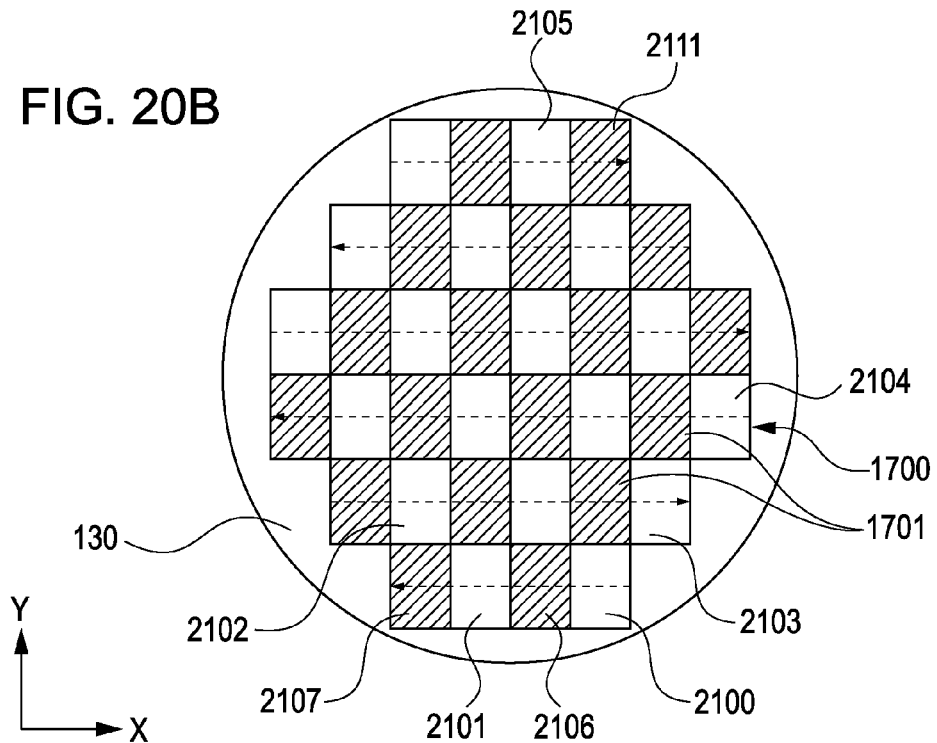
FIG. 20B is a diagram illustrating an example of the step-and-repeat imprint according to the fifth embodiment of the present invention.

FIGS. 20A and 20B show the step-and-repeat imprint of this embodiment. White portions 1700 are first repeat process regions in which the pattern is to be transferred to the photo cure resin 200 in the first repeat process. Shaded portions 1701 are second repeat process regions in which the pattern is to be transferred to the photo cure resin 200 in the second repeat process. FIG. 20A is a diagram showing an example of the arrangement of the first repeat process regions 1700 and the second repeat process regions 1701 on the substrate 130. In the first repeat process, the step-and-repeat imprint is first performed on regions 2000 to 2001 in the positive direction of the x-axis. When a new line is started, the process moves in the positive direction of the y-axis. After the new line is started, the step-and-repeat imprint is performed on regions 2002 to 2003 in the positive direction of the x-axis so that the first repeat process regions 1700 on the first and second lines are located next to each other in the direction of the y-axis. Likewise, the step-and-repeat imprint is performed up to a region 2004 while a new line is started repeatedly. Next, in the second repeat process, the step-and-repeat imprint is performed in the positive direction of the x-axis on regions that were skipped in the first repeat process, that is, regions 2005 to 2006. Likewise, a new line is started in the positive direction of the y-axis, and the step-and-repeat imprint is performed up to a region 2009. FIG. 20B is a diagram showing another example of the arrangement of the first repeat process regions 1700 and the second repeat process regions 1701 on the substrate 130. In the first repeat process, the step-and-repeat imprint is first performed on regions 2100 to 2101 in the negative direction of the x-axis. When a new line is started, the process moves in the positive direction of the y-axis. After the new line is started, the step-and-repeat imprint is performed on regions 2102 to 2103 so that the first repeat process regions 1700 on the first and second lines are not located next to each other in the direction of the x-axis. Likewise, the step-and-repeat imprint is performed on regions 2104 to 2105 so that the first repeat process regions 1700 on adjacent lines are not located next to each other in the direction of the x-axis. In the second repeat process, the step-and-repeat imprint is performed in the negative direction of the x-axis on regions that were skipped in the first repeat process, that is, regions 2106 to 2107. Likewise, a new line is started in the positive direction of the y-axis, and the step-and-repeat imprint is performed up to a region 2111.

In this embodiment, as in FIGS. 10A and 10B, the resin deposition process can be performed on a line different from a line that is in the imprint process when a new line is started, in parallel with the imprint process, by driving the first-resin-depositing-unit driving unit 142 or the second-resin-depositing-unit driving unit 144. This allows the imprint process to be performed when a new line is started without waiting for the resin deposition process on the first shot of a new line, thus increasing the throughput.

It is needless to say that the number and locations of shots and the direction of the step-and-repeat imprint do not limit the present invention.

Such a step-and-repeat method does not perform the resin deposition process on a region next to a region in the imprint process, in parallel with the imprint process. This allows pattern-transferred photo cure resins formed by the shots to be arranged with no gap therebetween without spatial interference between the mold holder 121 and the first resin depositing unit 140. This is advantageous in the case where the width of the mold holder 121 in the direction of the x-y plane is larger than the width of the mold 120 in the direction of the x-y plane. This is also advantageous in the case where the mold 120 and the first resin depositing unit 140 must have a sufficient distance therebetween because of circumstances such as when a member around the mold 120 is large.

Furthermore, since such a step-and-repeat method can perform the resin deposition process just before the imprint process of the shot, this is also advantageous against the issue of evaporation after the resin 200 is deposited until it is cured.

Such a method does not perform the resin deposition process on a region next to a region in the imprint process, in parallel with the imprint process. This is advantageous in the case where light for curing the resin in the imprint process influences on the resin deposition process performed in the adjacent region and the deposited photo cure resin 200.

Such a method does not perform the resin deposition process on a region next to a region in the imprint process, in parallel with the imprint process. This is advantageous in the case where heat for hardening the resin in the imprint process influences on the resin deposition process performed in the adjacent region and the deposited photo cure resin 200.

A method of performing the step-and-repeat imprint with two or more shots skipped can be adopted in the case where much more time is taken for dispersing the heat. That is, the step-and-repeat imprint may be performed by skipping an interval larger than the width (region) processed by the resin deposition process and the imprint process, for example, an interval integer times as large as the width processed by the resin deposition process and the imprint process.

In this embodiment, the resin deposition process is performed with two shots or more skipped in the x-direction; the resin deposition process may also be performed with two shots or more skipped in the y-direction.

While this embodiment is described about the case of one resin depositing unit, the invention can also be applied to the case of two or more resin depositing units, as in the third embodiment, in which they individually perform the resin deposition process with two shots or more skipped.

As described above, the present invention allows the resin deposition process for depositing resin on the substrate and the imprint process to be performed in parallel. For general resin deposition processes, it is necessary to decrease the speed of the stage so that a desired amount of resin can be deposited to a desired position, resulting in the issue that the resin deposition process takes much time. In general, the time taken for the imprint process is longer than the time taken for the resin deposition process. Therefore, as in the present invention, performing the imprint process and the resin deposition process in parallel reduces an influence on the throughput even if the resin deposition process takes more or less time. Furthermore, since the time for the imprint process at the maximum can be used for the resin deposition process, the amount and location of resin to be deposited can be made more accurate.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

What is claimed is:

1. An imprinting apparatus that transfers a pattern of a mold to a resin on a substrate by a step-and-repeat imprint, the imprinting apparatus comprising:
   a substrate stage consisting of a single substrate stage; a deposition mechanism configured to deposit the resin onto the substrate;
   a first driving mechanism configured to change a relative position, on a plane parallel to the surface of the substrate, of the substrate and the mold;
   a second driving mechanism configured to change the relative position, on a plane parallel to the surface of the substrate, of the mold and the deposition mechanism; and
   a control unit configured to control the deposition mechanism and the first and second driving mechanisms so as to perform an N+Mth resin deposition process of depositing the resin onto the substrate and an Nth imprint process of transferring the pattern of the mold to the resin on the substrate in parallel, wherein N and M are positive integers;
   wherein a driving range of the second driving mechanism is wider than a size of the pattern of the mold such that M may be an integer greater than one; and
   wherein the control unit is configured to change a relative position of the mold and the deposition mechanism in performing the resin deposition process and the imprint process in parallel.

2. The imprinting apparatus according to claim 1, further comprising:
   a housing configured to accommodate the deposition mechanism, the first driving mechanism, and the second driving mechanism,
   wherein the first driving mechanism is disposed between the substrate and the housing, and
   wherein the second driving mechanism is disposed between the deposition mechanism and the housing.

3. The imprinting apparatus according to claim 1, further comprising:
   a housing configured to accommodate the deposition mechanism, the first driving mechanism, and the second driving mechanism,
   wherein the first driving mechanism is disposed between the substrate and the housing, and
   wherein the second driving mechanism is disposed between the deposition mechanism and a member that joins the mold to the housing.

4. The imprinting apparatus according to claim 1, further comprising a plurality of the deposition mechanisms and a plurality of the second driving mechanisms.

5. The imprinting apparatus according to claim 1, wherein the control unit performs the control so as to perform the $N^{th}$ imprint process and the $N+M^{th}$ resin deposition process in parallel, where N is a positive integer and M is an integer greater than or equal to 2.

6. The imprinting apparatus according to claim 1, wherein the control unit performs the continuous resin deposition process and imprint process at intervals larger than the widths of areas on the substrate on which the processes will be performed.

7. The imprinting apparatus according to claim 6, wherein the interval between the continuous resin deposition process and imprint process is an integral multiple of the width of an area on the substrate on which each process will be performed.

* * * * *